(12) United States Patent
Tinnemans et al.

(10) Patent No.: US 7,864,295 B2
(45) Date of Patent: Jan. 4, 2011

(54) LITHOGRAPHIC APPARATUS AND DEVICE MANUFACTURING METHOD UTILIZING DATA FILTERING

(75) Inventors: Patricius Aloysius Jacobus Tinnemans, Hapert (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 250 days.

(21) Appl. No.: 12/166,837

(22) Filed: Jul. 2, 2008

(65) Prior Publication Data

US 2009/0011345 A1    Jan. 8, 2009

Related U.S. Application Data

(62) Division of application No. 11/093,259, filed on Mar. 30, 2005, now Pat. No. 7,403,265.

(51) Int. Cl.
*G03B 27/54* (2006.01)
*G03B 27/32* (2006.01)
(52) U.S. Cl. .................................... 355/67; 355/77
(58) Field of Classification Search ................ 355/53, 355/76, 77, 67; 250/492.2; 430/30
See application file for complete search history.

(56) References Cited

U.S. PATENT DOCUMENTS

| | | | |
|---|---|---|---|
| 4,879,605 A | 11/1989 | Warkentin et al. | |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |

(Continued)

FOREIGN PATENT DOCUMENTS

EP    0 794 552 A2    9/1997

(Continued)

OTHER PUBLICATIONS

Translation of Japanese Notice of Reasons for Refusal for Patent Application No. 2006-089853 mailed Jan. 27, 2009, 3 pgs.

(Continued)

*Primary Examiner*—Alan A Mathews
(74) *Attorney, Agent, or Firm*—Sterne, Kessler, Goldstein & Fox P.L.L.C.

(57) ABSTRACT

An apparatus and method are used to form patterns on a substrate. The apparatus comprises a projection system, a patterning device, a low-pass filter, and a data manipulation device. The projection system projects a beam of radiation onto the substrate as an array of sub-beams. The patterning device modulates the sub-beams to substantially produce a requested dose pattern on the substrate. The low-pass filter operates on pattern data derived from the requested dose pattern in order to form a frequency-clipped target dose pattern that comprises only spatial frequency components below a selected threshold frequency. The data manipulation device produces a control signal comprising spot exposure intensities to be produced by the patterning device, based on a direct algebraic least-squares fit of the spot exposure intensities to the frequency-clipped target dose pattern. In various examples, filters can also be used.

9 Claims, 12 Drawing Sheets

U.S. PATENT DOCUMENTS

| | | |
|---|---|---|
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,727,977 B2 | 4/2004 | Butler |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,888,616 B2 | 5/2005 | Cooper et al. |
| 6,934,421 B2 | 8/2005 | Gindele et al. |
| 7,239,735 B2 | 7/2007 | Nozaki |
| 7,403,265 B2 | 7/2008 | Tinnemans et al. |
| 7,423,732 B2 | 9/2008 | Lipson et al. |
| 7,618,751 B2 | 11/2009 | Sandstrom et al. |
| 2004/0041104 A1 | 3/2004 | Liebregts et al. |
| 2004/0051855 A1 | 3/2004 | Cooper et al. |
| 2004/0130561 A1 | 7/2004 | Jain |
| 2004/0251430 A1* | 12/2004 | Sandstrom ............... 250/492.2 |
| 2005/0007572 A1 | 1/2005 | George et al. |
| 2005/0018164 A1 | 1/2005 | Hansen |
| 2005/0157285 A1 | 7/2005 | Schothorst et al. |
| 2006/0132746 A1 | 6/2006 | Baselmans et al. |
| 2006/0219502 A1 | 10/2006 | De La Fuente-Farias |
| 2008/0068569 A1 | 5/2008 | Mulckhuyse et al. |
| 2008/0143982 A1 | 6/2008 | Troost et al. |

FOREIGN PATENT DOCUMENTS

| | | |
|---|---|---|
| EP | 1 482 375 A2 | 12/2004 |
| EP | 1 491 960 A2 | 12/2004 |
| EP | 1 517 188 A2 | 3/2005 |
| JP | 2000-58440 A | 2/2000 |
| JP | 2001-175857 A | 6/2001 |
| JP | 2002-367900 A | 12/2002 |
| JP | 2003-331284 A | 11/2003 |
| JP | 2003-331285 A | 11/2003 |
| JP | 2004-356633 A | 12/2004 |
| JP | 2006-135332 A | 5/2006 |
| WO | WO 98/33096 A1 | 7/1998 |
| WO | WO 98/38597 A2 | 9/1998 |
| WO | WO 98/38597 A3 | 9/1998 |
| WO | WO 02/073288 A1 | 9/2002 |
| WO | WO 2004/111701 A1 | 12/2004 |
| WO | WO 2005/047955 A1 | 5/2005 |
| WO | WO 2005/081070 A1 | 9/2005 |

OTHER PUBLICATIONS

English Abstract for Japanese Publication No. 2006-527418 T published Nov. 30, 2006, 2 pgs.

English Translation of Search Report, dated Mar. 29, 2007, for KR Patent Application No. 10-2006-0029223, 3 pgs. cited by other.

Australian Search Report, dated Apr. 27, 2007, for Singapore Application No. SG 200602145-5, 9 pgs. cited by other.

European Search Report and Written Opinion for EP 06 251 482.3 mailed Sep. 18, 2007, 18 pgs.

Non-Final Rejection mailed Nov. 19, 2009 for U.S. Appl. No. 11/522,533, 16 pgs.

Non-Final Rejection mailed Apr. 21, 2010 for U.S. Appl. No. 11/522,533, 12 pgs.

Notification of Reasons for Refusal mailed Sep. 28, 2010 for Japanese Patent Application No. 2007-240425, 3 pgs.

* cited by examiner

LITHOGRAPHIC APPARATUS AND DEVICE MANUFACTURING METHOD UTILIZING DATA FILTERING

CROSS-REFERENCE TO RELATED APPLICATIONS

This application is a divisional of U.S. patent application Ser. No. 11/093,259, filed on Mar. 30, 2005, now U.S. Pat. No. 7,403,265, the disclosure of which is incorporated herein by reference in its entirety.

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), micro-electro-mechanical-systems (MEMS), and other devices involving fine structures. In a conventional apparatus, a contrast device or a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. Compared to mask-based system, the pattern can be changed more quickly and for less cost.

In general, a flat panel display substrate is rectangular in shape. Known lithographic apparatus designed to expose a substrate of this type typically provide an exposure region, which covers a full width of the rectangular substrate, or which covers a portion of the width (e.g., about half of the width). The substrate is scanned underneath the exposure region, while the mask or reticle is synchronously scanned through the beam. In this way, the pattern is transferred to the substrate. If the exposure region covers the full width of the substrate, then exposure is completed with a single scan. If the exposure region covers, for example, half of the width of the substrate, then the substrate is moved transversely after the first scan, and a second scan is performed to expose the remainder of the substrate.

Another way of imaging includes pixel grid imaging, in which a pattern is realized by successive exposure of spots.

Where the pattern on the substrate is built up from a grid of localized exposures or "spot exposures," it is found that the quality of the pattern formed at a particular point can depend on where that point is located relative to the spot exposure grid positions. Furthermore, a variation in pattern quality can be found to exist with respect to the angle of a feature in the pattern relative to axes defining the grid. Either or both of these variations can have a negative influence on the quality of a device to be manufactured.

The image log slope of a pattern determines the resist side-wall angle of features formed after processing of an exposed substrate. A shallow image log slope implies a shallow side wall angle, which can be useful, for example, for achieving a wide viewing angle for Flat Panel Displays or can reduce the consequences of overlay errors. Steeper image log slopes and side wall angles provide greater contrast. The maximal image log slope is determined by the point spread functions of the spot exposures in the grid, and on the geometrical properties of the grid. In general, therefore, the image log slope is fixed once the corresponding hardware elements have been finalized. However, it can be desirable to vary the image log slope according to the nature of the application.

The critical dimension (CD) refers to the size of the smallest printable feature. Although the CD of the dose pattern can be defined quite accurately prior to exposure, it is more difficult to predict the CD properties of the pattern after post-exposure processing. Frequently, it is desirable to tweak the CD after inspection of a processed substrate in order to optimize the processed pattern according to a customer's requirements. One way this can be achieved is to vary the intensity of the radiation source. The more intense it is, the more the resulting pattern is spread out (normally leading to an increased CD). However, CD biasing in this way can only be applied uniformly and in a circularly symmetrical fashion over the surface of the substrate.

Variation in the position of the substrate surface relative to the plane of best focus can cause deterioration in the quality of the image formed on the substrate. Complex servo and control systems can be provided to translate and/or tilt the substrate table and/or projection system in order to keep the substrate near the plane of best focus but it is difficult to achieve perfect compensation. A residual focus error tends to be remain.

Where an array of individually controllable elements is used as a patterning device, some form of conversion tool is to translate requested spot exposure doses to voltages suitable for actuating the corresponding elements of the array at the appropriate times. For example, where the array of individually controllable elements comprises a mirror array, the voltages will be chosen so as to cause individual mirrors or groups of mirrors to tilt in such a way as to deflect an appropriate portion of incident radiation through the projection system. The relationship between the proportion of deflected radiation and the voltage/tilt angle can be complex (e.g., non-linear). Factors that affect the intensity/uniformity of the radiation incident on the array of individually controllable elements and variations in the optical properties of projection system components (e.g., variations between different optical columns) can also affect the intensity of radiation reaching the substrate and thereby reduce the quality of the pattern formed.

Where an array of individually controllable elements is used as a patterning device, ghost light (i.e., light originating from elements other than those that are supposed to be contributing to a particular sub-beam of radiation) can cause errors in the pattern formed on the substrate.

Therefore, what is needed is a system and method that more efficiently and effectively performs maskless lithography.

SUMMARY

According to one embodiment of the present invention, there is provided a lithographic apparatus comprising a projection system, a patterning device, a low pass filter, and a data manipulation device. The projection system project a beam of radiation onto a substrate as an array of sub-beams of radiation. The patterning device modulates the sub-beams of radiation to substantially produce a requested dose pattern on the substrate. The dose pattern is built up from an array of spot exposures in which at least neighboring spot exposures are imaged incoherently with respect to each other and each spot exposure is produced by one of the sub-beams of radiation at a particular time. The low-pass filter is arranged to operate on pattern data derived from the requested dose pattern in order to form a frequency-clipped target dose pattern that predominantly comprises only spatial frequency components below a selected threshold frequency. The data manipulation device produces a control signal comprising spot exposure intensities to be produced by the patterning device, based on a direct algebraic least-squares fit of the spot exposure intensities to the frequency-clipped target dose pattern.

According to one embodiment of the present invention, there is provided a lithography apparatus comprising a projection system, a patterning device, a data manipulation device, and a low pass filter. The projection system projects a beam of radiation onto a substrate as an array of sub-beams of radiation. The patterning device modulates the sub-beams of radiation in order substantially to produce a requested dose pattern on the substrate. The dose pattern is built up from an array of spot exposures in which at least neighboring spot exposures are imaged incoherently with respect to each other and each spot exposure is produced by one of the sub-beams of radiation at a particular time. The data manipulation device produces a control signal comprising spot exposure intensities to be produced by the patterning device. The control signal is based on a direct algebraic least-squares fit of the spot exposure intensities to data derived from the requested dose pattern. The least-squares fit is performed by multiplying a pseudo-inverted form of a point-spread function matrix by a column vector representing the pattern data derived from the requested dose pattern, the point-spread function matrix comprising information about the shape and relative position of the point-spread function of each spot to be exposed on the substrate by one of the sub-beams of radiation at a given time. The low-pass filter removes spatial frequency components of a signal above a selected threshold frequency, incorporated offline into the pseudo-inverted form of the point-spread-function matrix, ready for the least-squares fit, by the following operation:

$$[K]^+_{filtered} = F_{low\text{-}pass\,filter} \otimes [K]^+,$$

where $[K]^+$ and $[K]^+_{filtered}$ represent the pseudo-inverted form of the point-spread function matrix respectively before and after filtering, and where $F_{low\text{-}pass\,filter}$ represents a mathematical definition of the low-pass filter in the spatial domain.

According to one embodiment of the present invention, there is provided a lithography apparatus comprising a projection system, an array of individually controllable elements, a rasterizer device, a data manipulation device, and a focus determination unit. The projection system projects a beam of radiation onto a substrate as an array of sub-beams of radiation. The array of individually controllable elements modulates the sub-beams of radiation so as substantially to form a requested dose pattern on the substrate, the requested dose pattern being built up over time from an array of spot exposures, each spot exposure being produced by one of the sub-beams of radiation at a given time. The rasterizer device converts data defining the requested dose pattern to a sequence of data representing the requested dose at a corresponding sequence of points within the pattern. The data manipulation device receives the sequence of data and generates a control signal therefrom suitable for controlling the array of individually controllable elements. The focus determination unit measures the position of at least a portion of the substrate relative to a plane of best focus. The data manipulation device comprises a focus compensation unit that adapts the control signal based on measured deviations of the at least a portion of the substrate relative to the plane of best focus.

According to one embodiment of the present invention, there is provided a lithography apparatus comprising a patterning device, a projection system, and a CD-biasing filter. The patterning device modulates a beam of radiation. The projection system projects the modulated beam of radiation onto a substrate. The CD-biasing filter operates on pattern data derived from a requested dose pattern, which is to be fed to the patterning device, in order to control the critical dimension characteristics of a radiation dose pattern produced by the patterning device.

According to one embodiment of the present invention, there is provided a lithography apparatus comprising an illumination system, a projection system, a patterning device, and a data manipulation device. The illumination system conditions a beam of radiation. The projection system projects the beam of radiation onto the substrate as an array of sub-beams of radiation. The patterning device modulates the sub-beams of radiation to substantially produce a requested dose pattern on the substrate. The dose pattern is built up from an array of spot exposures, each spot exposure being produced by one of the sub-beams of radiation at a particular time. The radiation intensity of a given sub-beam of radiation is controlled according to an activation state of a corresponding portion of the patterning device. The data manipulation device transforms a signal comprising spot exposure radiation doses derived from the requested dose pattern to a control signal representing activation states of the patterning device substantially to produce the requested dose pattern. The transformation is adapted in order to correct for intensity variations caused by at least one of the following: components of the projection system, components of the illumination system, radiation sources for the illumination system, and components of the patterning device.

According to one embodiment of the present invention, there is provided a device manufacturing method comprising the following steps. Providing a projection system to project a beam of radiation onto a substrate as an array of sub-beams of radiation. Providing a patterning device that modulates the sub-beams of radiation to substantially produce a requested dose pattern on the substrate. The dose pattern is built up from an array of spot exposures in which at least neighboring spot exposures are imaged incoherently with respect to each other and each spot exposure is produced by one of the sub-beams of radiation at a particular time. Using a low-pass filter to operate on pattern data derived from the requested dose pattern in order to form a frequency-clipped target dose pattern that comprises only spatial frequency components below a selected threshold frequency. Using a data manipulation device to produce a control signal comprising spot exposure intensities to be produced by the patterning device, based on a direct algebraic least-squares fit of the spot exposure intensities to the frequency-clipped target dose pattern.

According to one embodiment of the present invention, there is provided a device manufacturing method comprising the following steps. Providing a projection system that projects a beam of radiation onto a substrate as an array of sub-beams of radiation. Providing a patterning device that modulates the sub-beams of radiation in order substantially to produce a requested dose pattern on the substrate. The dose pattern is built up from an array of spot exposures in which at least neighboring spot exposures are imaged incoherently with respect to each other and each spot exposure is produced by one of the sub-beams of radiation at a particular time. Using a data manipulation device to produce a control signal comprising spot exposure intensities to be produced by the patterning device, based on a direct algebraic least-squares fit of the spot exposure intensities to data derived from the requested dose pattern, wherein the least-squares fit is performed by multiplying a pseudo-inverted form of a point-spread function matrix by a column vector representing the pattern data derived from the requested dose pattern, the point-spread function matrix comprising information about the shape and relative position of the point-spread function of each spot to be exposed on the substrate by one of the sub-beams of radiation at a given time. Using a low-pass filter to remove spatial frequency components of a signal above a selected threshold frequency, incorporated offline into the pseudo-inverted form of the point-spread-function matrix, ready for the least-squares fit, by the following operation: $[K]^+_{filtered} = F_{low-pass\ filter} \otimes [K]^+$, where $[K]^+$ and $[K]^+_{filtered}$ represent the pseudo-inverted form of the point-spread function matrix respectively before and after filtering, and where $F_{low-pass\ filter}$ represents a mathematical definition of the low-pass filter in the spatial domain.

According to one embodiment of the present invention, there is a device manufacturing method comprising the following steps. Providing a projection system that projects a beam of radiation onto a substrate as an array of sub-beams of radiation. Providing an array of individually controllable elements that modulate the sub-beams of radiation so as substantially to form a requested dose pattern on the substrate. The requested dose pattern is built up over time from an array of spot exposures, each spot exposure being produced by one of the sub-beams of radiation at a given time. Providing a rasterizer device that converts data defining the requested dose pattern to a sequence of data representing the requested dose at a corresponding sequence of points within the pattern. Using a data manipulation device to receive the sequence of data and generate a control signal therefrom suitable for controlling the array of individually controllable elements. Using a focus determination unit to measure the position of at least a portion of the substrate relative to a plane of best focus. Using a focus compensation unit to adapt the control signal based on measured deviations of the at least a portion of the substrate relative to the plane of best focus.

According to one embodiment of the present invention, there is provided a device manufacturing method comprising the following steps. Providing a patterning device that modulates a beam of radiation. Providing a projection system that projects the modulated beam of radiation onto a substrate. Using a CD-biasing filter to operate on pattern data derived from a requested dose pattern, which is to be fed to the patterning device, in order to control the critical dimension characteristics of a radiation dose pattern produced by the patterning device.

According to one embodiment of the invention, there is a device manufacturing method comprising the following steps. Providing an illumination system that conditions a beam of radiation. Providing a projection system that projects the beam of radiation onto the substrate as an array of sub-beams of radiation. Providing a patterning device that modulates the sub-beams of radiation to substantially produce a requested dose pattern on the substrate. The dose pattern is built up from an array of spot exposures, each spot exposure being produced by one of the sub-beams of radiation at a particular time. The radiation intensity of a given sub-beam of radiation is controlled according to an activation state of a corresponding portion of the patterning device. Using a data manipulation device to transform a signal comprising spot exposure radiation doses derived from the requested dose pattern to a control signal representing activation states of the patterning device substantially to produce the requested dose pattern. Adapting the transformation to correct for intensity variations caused by at least one of the following: components of the projection system, components of the illumination system, radiation sources for the illumination system, and components of the patterning device.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

The present invention will now be described with reference to the accompanying drawings. In the drawings, like reference numbers can indicate identical or functionally similar elements.

DETAILED DESCRIPTION

Figure 1:
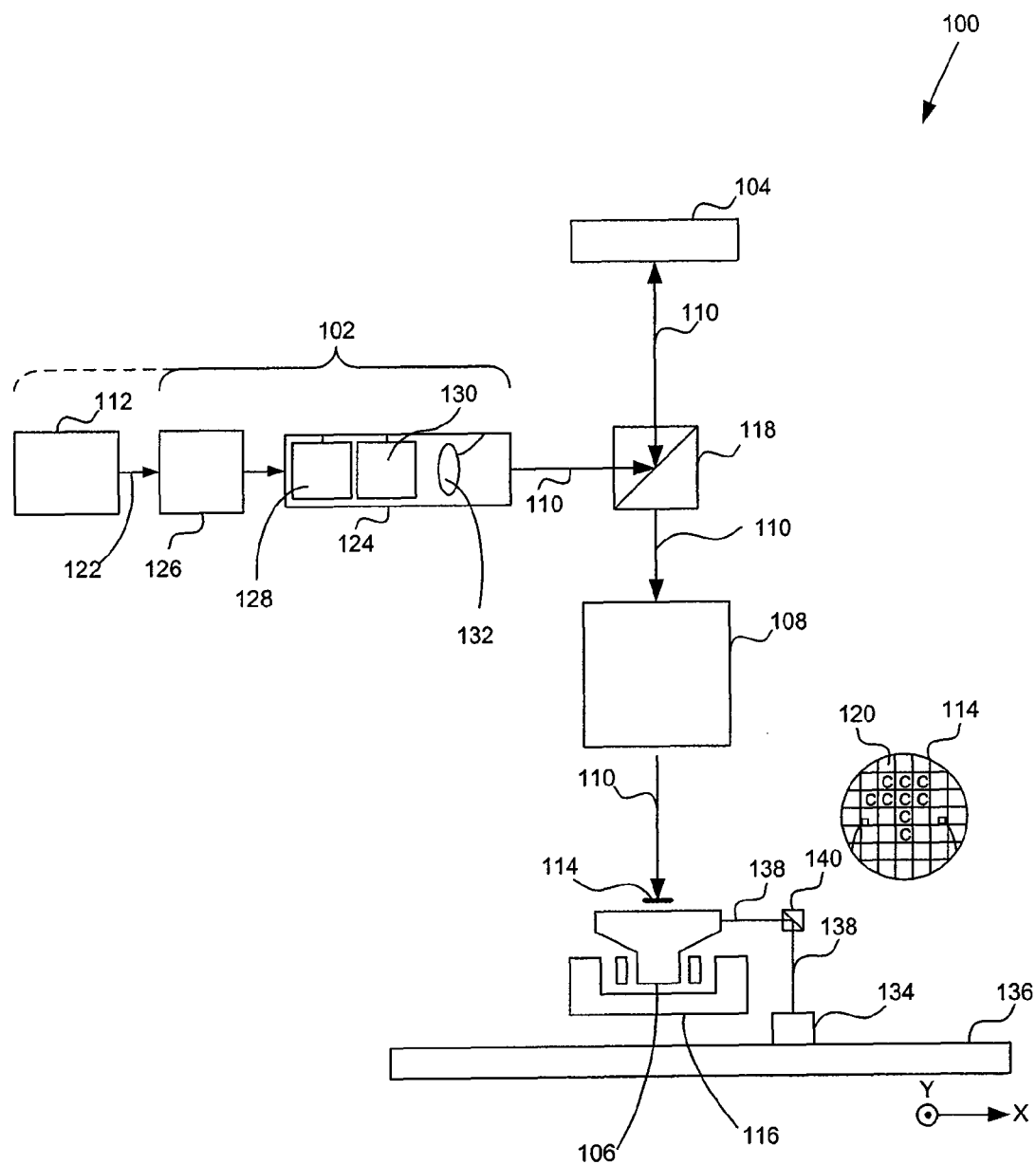
FIG. 1 depicts a lithographic apparatus, according to one embodiment of the present invention.

In one embodiment of the present invention provides a blazing portion in a section of an array of individually controllable elements (e.g., a contrast device). All the elements in the blazing portion have their individually controllable elements positioned at a same angle, which forms the blazing portion. In one example, this can be accomplished through use of a super-pixel. The blazing portion is used to increase light intensity in a first diffraction order a beam modulated by the array. This is accomplished by substantially eliminating a negative first diffraction order modulated beam, such that the positive first diffraction order modulated beam has, in effect, about equal to or more than twice the intensity compared to a typical positive first diffraction order modulated beam. For example, when using a $\lambda/4$ tip deflection, substantially all of the incident light is reflected in the first diffraction order.

In another embodiment, instead of a first diffraction order, a higher diffraction order can be used by higher tip deflection. For instance, all the light is concentrated in the second diffraction order for $\lambda/2$ tip deflection. It is to be appreciated that all the light is concentrated in the n-th diffraction order upon n times $\lambda/4$ tip deflection.

In another embodiment, perpendicular projection is accomplished by directing light onto the array at a diffraction order of interest (which is used within the projection part), where the light can also impinge on a blazing portion of the array, such that the projected light leaves the contrast device perpendicular.

Thus, in one example, through use of a blazing portion it is possible to concentrate substantially all of the diffracted energy in the order of interest (e.g., a diffraction order) towards a substrate.

In another embodiment, "partial coherent imaging" mode can be used, during which the array of individually controllable elements is imaged at the substrate, however no super-pixels are used.

Overview and Terminology

The use of "object," "substrate," "work piece," or the like are interchangeable in this application, and can be, but are not limited to, a work piece, a substrate (e.g., a flat panel display glass substrate), a wafer (e.g., a semiconductor wafer for integrated circuit manufacture), a print head, micro or nano-fluidic devices, a display panel in a projection display system, or the like.

The terms "contrast device," "patterning device," "patterning array," or "array of individually controllable elements" used herein should be broadly interpreted as referring to any device that can be used to modulate the cross-section of a radiation beam such as to create a pattern in a target portion of a substrate (e.g., object). It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate 114/214/314ill correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g., to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as within the scope of the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate 114/214/314hereupon the resist is cured by applying electromagnetic radiation, heat, pressure or a combination thereof. The patterning device is moved out of the resist leaving a pattern in it after the resist is cured.

In another example, the invention can take the form of a computer program containing one or more sequences of machine-readable instructions describing a method as disclosed above, or a data storage medium (e.g., semiconductor memory, magnetic or optical disk) having such a computer program stored therein.

Exemplary Environment

FIG. 1 schematically depicts a lithographic projection apparatus 100, according to one embodiment of the present invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation, 248 nm, 193 nm, 157 nm, EUV radiation, e.g., 10-13 nm, etc.), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials or a mirror system) can be used for projecting the patterned beam received from a directing device 118 (e.g., a beam splitter).

Light is directed from directing device 118 onto a target portion 120 (e.g., one or more dies) of substrate 114. Projection system 108 can project an image of the array of individually controllable elements 104 onto substrate 114.

The illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using directing device 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is u104/204ated as between pulses of radiation system 102 and the pulses are timed such that successive target portions 120 are exposed at the locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is u104/204ated as patterned beam 110 scans across substrate 114 and exposes it.

In these first four exemplary modes, "partial coherent imaging" is typically performed for integrated circuit formation. Using this imaging, each element in an array of individually controllable elements has a unique tilt. The array is positioned at the object plane and the substrate is positioned at the image plane of the imaging projection optics. Various illumination modes can be applied: annular, conventional, quadrupole, dipole etc. Also, different configurations for each element in an array of individually controllable elements can be used to increase the "negative black" values: phase step mirrors, applying larger tilts, shaping the mirrors (butterfly, H-shape), or the like.

Combinations and/or variations on the above described modes of use or entirely different modes of use can also be employed.

Figure 2:
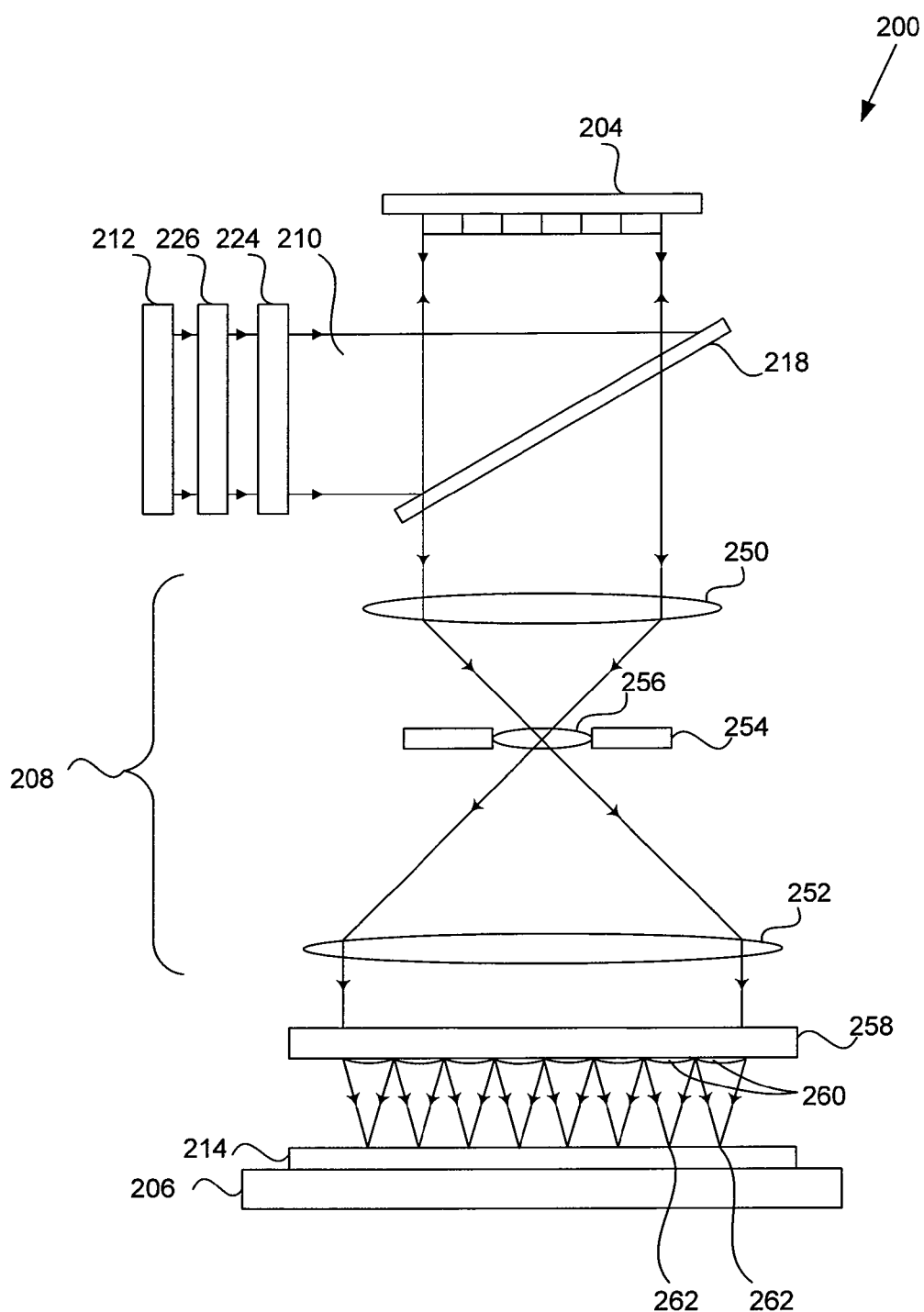
FIG. 2 depicts a lithographic apparatus that can be used, for example, in the manufacture of a flat panel display, according to one embodiment of the present invention.

FIG. 2 depicts a lithographic apparatus 200, according to one embodiment of the present invention. For example, apparatus 200 can be especially useful in the manufacture of flat panel displays using a pixel grid imaging mode, discussed below.

Projection system 208 can project images of secondary sources for which the elements of the array of individually controllable elements 204 act as shutters.

In an imaging grid array embodiment, projection system 208 can also comprise a micro lens array (MLA) to form the secondary sources and to project microspots onto substrate 214.

Source 212 (e.g., a frequency tripled Nd:YAG laser in pixel grid imaging mode or an excimer laser in other modes) can produce a beam of radiation 222. Beam 222 is fed into an illumination system (e.g., illuminator) 224, either directly or after having traversed conditioning device 226, such as a beam expander, for example.

In one example, when apparatus 200 is operating in a pixel grid imaging mode, discussed below, illuminator 224 can comprise an adjusting device for setting a zoom to adjust a spot size of beam 222. In addition, illuminator 224 will generally include various other components, such as spot generator and a condenser. For example, spot generator can be, but is not limited to, a refractive or diffractive grating, segmented mirrors arrays, waveguides, or the like. In this way, beam 210 impinging on the array of individually controllable elements 204 has a desired zoom, spot size, uniformity, and intensity distribution in its cross section.

As shown in FIG. 2, projection system 208 includes a beam expander, which comprises two lenses 250 and 252. First lens 250 is arranged to receive a modulated radiation beam 210 and focus it through an aperture in an aperture stop 254. In one example, a lens 256 is located in the aperture. Radiation beam 210 then diverges and is focused by second lens 252 (e.g., a field lens).

Projection system 208 further comprises an array of lenses 258 (e.g., a microlens array (MLA)) arranged to receive expanded modulated radiation 210. Different portions of the modulated radiation beam 210, corresponding to one or more of the individually controllable elements in a patterning or contrast device 204, pass through respective lenses 260 in MLA 258. Each lens 260 focuses the respective portion of the modulated radiation beam 210 to a point which lies on a substrate 214. In this way, an array of radiation spots 262 are exposed onto substrate 214. Although only eight lenses 260 are shown, MLA 258 can comprise many thousands of lenses, which is also true of a number of individually controllable elements in the array of individually controllable elements used as patterning or contrast device 204.

The system in FIG. 2 allows for another mode of operation, Pixel Grid Imaging Mode. In this mode the pattern formed on substrate 214 is realized by subsequent exposure of spots formed by spot generator 130 that are directed onto array 204. The exposed spots have substantially the same shape. On substrate 214 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

In one example, using this mode, which is typically used for formation of flat panel displays, individually controllable elements can be grouped into super-pixels. One super-pixel modulates the light of one spot at the substrate. The super-pixel is imaged at the entrance of an MLA in the exit pupil of each spot printed. The spot shape can be influenced by the illuminator through use of spot defining element (e.g., spot generators), zoom of blazing functions, or the like.

Figure 3:
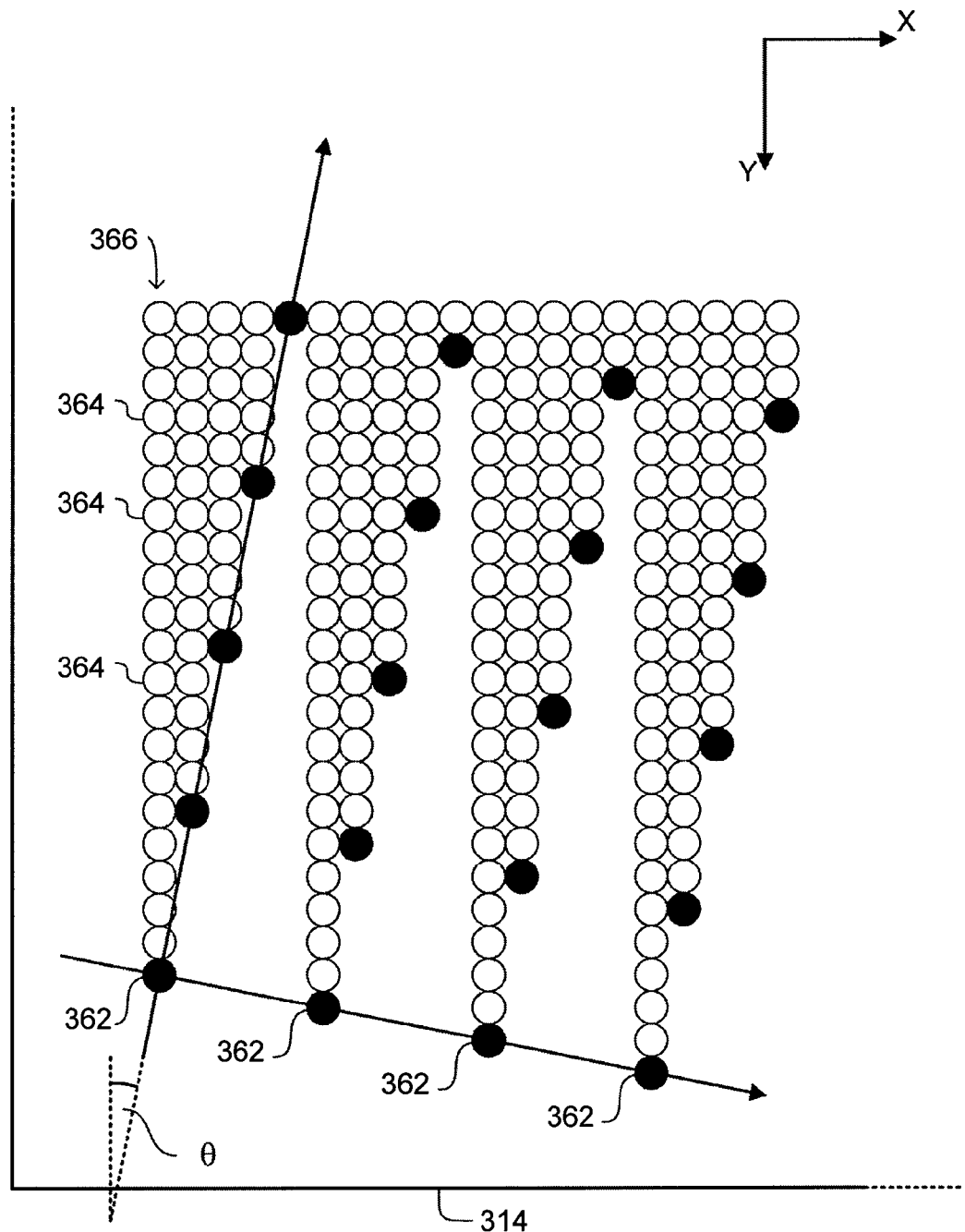
FIG. 3 depicts a mode of transferring a pattern to a substrate using a lithographic apparatus, according to one embodiment of the present invention.

FIG. 3 illustrates schematically how a pattern on a substrate 314 is generated, according to one embodiment of the present invention. For example, this embodiment can be performed using the pixel grid imaging mode discussed above.

The darkened circles 362 represent spots recently projected onto substrate 314 by a MLA in a projection system, for example the projection system as shown in FIG. 2. Substrate 314 is moved relative to the projection system in a Y direction as a series of exposures are exposed on substrate 314.

The open circles 364 represent spots that have previously been exposed on substrate 314. As shown, each spot 362 projected onto substrate 314 using the array of lenses within the projection system exposes a row 366 of spot exposures 362/364 on substrate 314. The complete pattern for substrate 314 is generated by the sum of all the rows 366 of spot exposures 364 exposed by each of the spots 362. Such an arrangement is commonly referred to as "pixel grid imaging," which was discussed above.

It can be seen that the array of radiation spots 362 is arranged at an angle θ relative to substrate 314 (i.e., when the edges of the substrate 314 lie parallel to the X and Y directions). This is done so that when substrate 314 is moved in a scanning direction (e.g., the Y-direction), each radiation spot 362 will pass over a different area of substrate 314, thereby allowing the entire substrate to be covered by the array of radiation spots. It will be appreciated that for ease of illustration the angle θ is exaggerated in FIG. 3.

It is to be appreciated that although 5×5 spots are shown in between two neighboring spots of the MLA, in one example up to about 100×100 spots can be used.

In one example, a spot grid at a substrate is about half a minimum linewidth to be printed (e.g., from about 0.1 microns up to a few microns), while a spot pitch at a MLA is about 100 micrometers up to about a few hundred micrometers.

Figure 4:
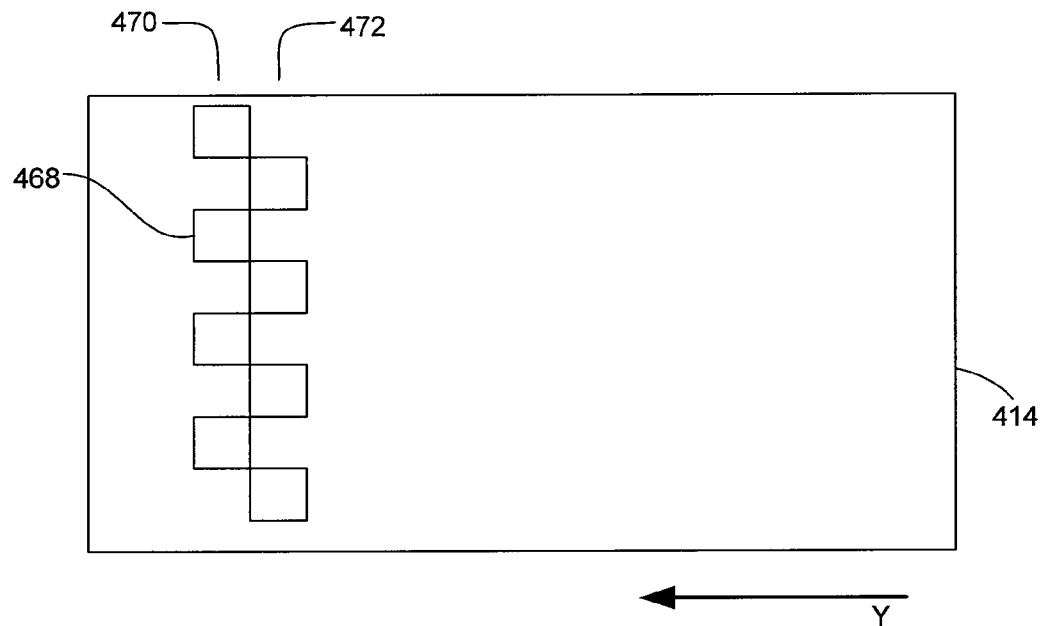
FIG. 4 depicts an arrangement of optical engines for exposing a pattern on a substrate, for example, used to manufacture a flat panel display, according to one embodiment of the present invention.

FIG. 4 shows schematically how an entire flat panel display substrate 414 is exposed in a single scan through use of a plurality of optical engines, according to one embodiment of the present invention. Eight arrays 468 of radiation spots are produced by eight optical engines (not shown), arranged in two rows 470,472 in a "chess board" configuration, such that the edge of one array of radiation spots slightly overlaps (e.g., in the scanning direction Y) with the edge of the adjacent array of radiation spots. In this example, a band of radiation extends across a width of substrate 414, allowing exposure of the entire substrate to be performed in a single scan. It will be appreciated that any suitable number of optical engines can be used.

In one example, each optical engine can comprise a separate illumination system, patterning device, and/or projection system, as described above. It is to be appreciated, however, that two or more optical engines can share at least a part of one or more of the illumination system, patterning device, and projection system.

Each optical engine can comprise a separate illumination system, patterning device, and projection system, as described above. It is to be appreciated, however, that two or more optical engines can share at least a part of one or more of the illumination system, patterning device and projection system.

In order to manufacture a product using a lithographic process, a resist is uniformly applied to the surface of a substrate. A pattern of radiation is then exposed on the resist such that some regions on the resist receive relatively high doses of radiation, while other regions of the resist receive relative low doses of radiation. The resist above a given radiation dose threshold reacts and its stability is changed. After the exposure process, the substrate is subjected to further processing operations, which remove the resist that has not reacted. Accordingly, the resist remains on the substrate in the regions that received a radiation dose above the given threshold, but is removed from the regions that received a radiation dose below the threshold, exposing the substrate. Accordingly, the resist remains on the substrate in the regions receiving relatively high radiation doses and is removed from the regions on the substrate receiving a relatively low radiation dose. Therefore, by applying an appropriate pattern to the radiation beam exposing the substrate, it is possible to generate a substrate 114/214/314ith a pattern of regions of exposed substrate and regions covered by the resist. Subsequent processing steps are then performed to form part of the device on the substrate. For example, if a metal layer is applied to the substrate before the resist, the metal layer that is not protected by the patterned resist layer can be etched away. Accordingly, once the resist is removed, the substrate is left with a metal layer patterned according to the resist pattern, e.g., according to the pattern of the radiation beam.

It will be appreciated that a lithographic system is not limited to the examples described above. For example, so-called 'negative resists' can be used. When negative resist is used, radiation exposure of the resist makes it less stable. Accordingly, it is the resist that receives a radiation dose above a given level that is removed in the post-exposure processing. Accordingly, the pattern of resist remaining on the substrate corresponds to the regions on the substrate that receives a radiation dose below a given threshold. Similarly, the pattern of resist on the substrate can be used for a variety of purposes. For example, the exposed regions of the substrate (i.e., those not protected by a layer of resist) can be subjected to processing steps such as ion implantation.

The product pattern to be created on the substrate can be defined using a vector design package, such as GDSII. In a maskless system, the output file from such a design package is processed in order to derive a control signal suitable for controlling the patterning device so that it reproduces a requested dose-map of radiation on the substrate as accurately as possible. Where the patterning device comprises an array of individually controllable elements, the control signal contains information to manage switching of each element of the array of individually controllable elements for each flash of the radiation to be patterned by the array (e.g., typical strobe frequencies being in the region of 50 kHz for this application). Part of the processing can be carried out before exposure of the substrate begins (e.g., this is known as off-line image processing) and/or part of the processing can be carried out simultaneously or during a short period of time (e.g., a few seconds) immediately before the corresponding exposure (e.g., this is known as in-line processing). Due to the enormous volume of data, in-line processing has to be managed carefully in order that the control signal can be provided at an acceptable speed and reasonable cost to the patterning device.

Figure 5:
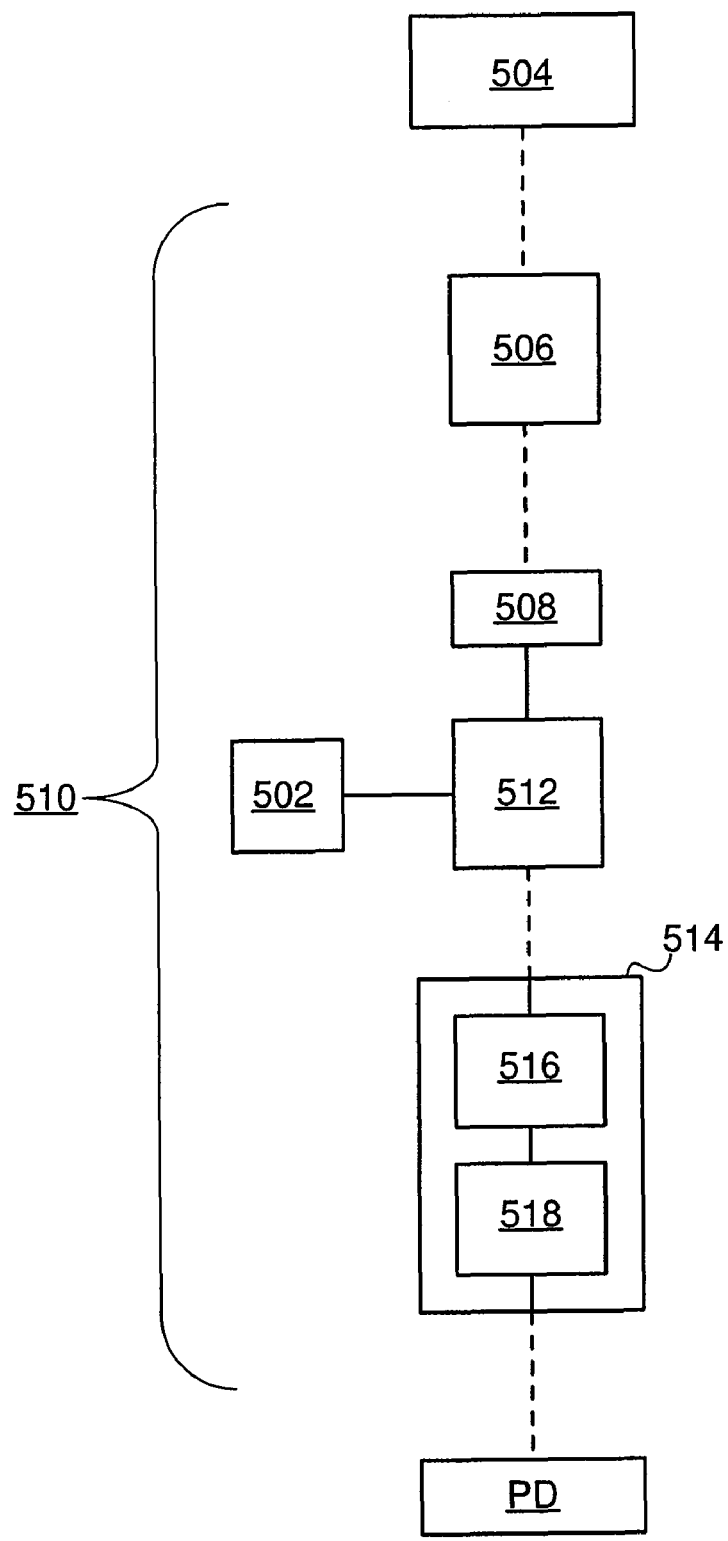
FIG. 5 depicts a data-path with data manipulation devices, according to one embodiment of the present invention.

FIG. 5 depicts a data-path 510 with data manipulation devices, according to one embodiment of the present invention. Data-path 510 notionally incorporates all data processing and transmission components that together allow the requested dose-map (as defined by a user via an input device 504) to be transferred to the patterning device 104/204 in an appropriate form. The data-path 510 comprises one or more data manipulation devices, each configured to analyse an incoming data stream comprising a (usually partly processed) version of the requested dose-map and output the signal to the patterning device 104/204 or to devices that will process the data stream further before passing it on to the patterning device 104/204. For example, an "inverse-optics" data manipulation device 512 (termed thus because it is concerned primarily with the consequences of the optical arrangement of the projection system) can be provided that is configured to calculate, for each pixel of the requested dose-map (which can for example be defined on a grid of points relative to the substrate 114/214/314), the intensity from contributing pixels or groups of pixels in the patterning device 104/204 in order to produce spot exposures SE with the appropriate dose. The inverse-optics device 512 then forwards data towards the patterning device 104/204 in such a way that the requested dose-map can be built up over time as the array of radiation spots S moves over the surface of the substrate 114/214/314.

For each grid point on which the requested pattern is defined, the inverse-optics device 512 has to deal with spot exposure intensity data for a number of spot 364 in the region of the grid point. This information is in turn derived from the requested pattern in the region of the grid point. In general, a "context radius" can be defined about any given grid point in the requested pattern, which defines the region of the requested pattern that has to be considered when calculating how to achieve the desired pattern at the grid point in question to a particular accuracy. The size of the context radius will depend on the shape and positional deviation (from perfectly defined grid positions) of the point-spread function for the spot 364. It will typically be chosen to be several times the spot pitch and/or full width half maximum (FWHM) of the point spread function of each of the spots printed, which might therefore extend over several microns. Other data manipulation devices, such as the "inverse-patterning-device" data manipulation device 514, will be described below.

In a typical application, the number of features to be written to the substrate 114/214/314 is enormous and data representing the whole requested dose pattern will not be available at any one time to hardware in the data-path 510 feeding the patterning device 104/204. As shown in FIG. 5, a rasterizer device 506 can be provided that converts the descriptive representation of the desired pattern input by a user via device 504 into a sequence of data that substantially corresponds to a sequence of spot 364 to be formed on the substrate 114/214/314 (not necessarily the same sequence in which the spot 364 will actually be produced—see below). Data representing the rasterized requested dose pattern is forwarded progressively over a period of time by the rasterizer 506 over the data-path 510 (broken line portions in the data-path represent sections which could comprise other data manipulation devices dealing with other aspects of the patterning process) until all of the requested pattern has been written onto the substrate 114/214/314.

The requested dose-map can be expressed as a column vector comprising elements that represent the dose at each one of a number of grid positions defined on the substrate 114/214/314. The grid positions in the requested dose-map can be specified relative to their coordinates in the metrology frame coordinate system: $x_{MF}$, $y_{MF}$. As mentioned above, this requested dose-map is to be built up from a collection of spot 364. Each of these spot 364 will have a certain point-spread function, which describes the cross-sectional spatial dependence of their intensity. In addition, there will be variations in the positions of each of the spots from their expected positions in the spot grid due to irregularities in the micro-lens array MLA used to focus the spots. Both the spot positions and the spot point-spread function shapes can be input to the inverse-optics device 512 via a calibration data storage device 502.

The process of forming an image in this way is referred to as pixel grid imaging. Mathematically, the requested dose-map is set to be equal to a sum over all possible spot 364 of intensity at each spot multiplied by a point-spread function for each spot. This can be written as the following equation:

$$D(x_{MF}, y_{MF}) = \sum_{n}^{all\ exposed\ spots} I_n \cdot PSF_n((x_{MF} - x_n), (y_{MF} - y_n)),$$

where $I_n$ represents the individual spot exposure "intensity" for spot n (it is conventional to refer to an "intensity" but, as this is normally proportional to energy dose, the parameter is sometimes expressed in Joules), $PSF_n((x_{MF}-x_n), (y_{MF}-y_n))$ represents the point-spread function (the dose contribution at location $x_{MF}-x_n$ and $y_{MF}-y_n$ of spot n), $x_n$ and $y_n$ indicate the position of an individual exposed spot and $D(x_{MF}, y_{MF})$ represents the requested dose-map in the coordinates of the metroframe supporting the lithographic apparatus.

The inverse-optics device 512 is configured to solve the following: given the requested dose-map and the point-spread function information (which is provided as calibration data), what are the individual spot exposure intensities (or corresponding desired sub-beam intensities) that need to be provided to image the requested dose-map as accurately as possible.

The above equation can be re-written in vector/matrix form as follows:

$$[D]=[K]\cdot[I],$$

where the column vector [D] represents the discrete (i.e., specified on specific substrate grid positions only) requested dose-map, the column vector [I] represents the individual spot exposure intensities and the matrix [K] represents the discrete point-spread functions.

Matrix [K] contains information on each individual spot exposure point-spread function (both position and shape). Therefore, according to the present embodiment, the following information is used in order to generate the matrix [K]: 1) scan speed/laser strobe frequency; 2) micro-lens array spot positions; 3) micro-lens array point spread function shape (the spot point spread function of the whole optical system, both projection/SLM and illumination); and 4) rotational position of the micro-lens array with respect the substrate scan direction (stage Y-axis).

In order to solve the above, the inverse-optics device 512 is arranged to determine the individual exposed spot intensities such that [D]−[K]·[I] is minimized. In order to assess this minimum, a normalization is used. Due to the fact that this approach must be applied in a pipeline environment (because not all of the spot exposures on the substrate are written at the same time) and the fact that one MLA spot is used to print many spot 364 (using many different laser pulses), it is to use the universal normalisation, in which specific knowledge of the requested pattern cannot be used. Use of such specific knowledge could in principle be incorporated but would lead to a large increase in the cost of the apparatus.

A least squares approach is therefore suitable and the to be solved by the inverse-optics device 512 can therefore be expressed as:

$$\min_{I_n} \|[D]-[K]\cdot[I]\|_2.$$

Several approaches have been used for solving least squares s of this general type. These can be classed as follows: 1) Geometric, using Jacobians (this is an iterative approach), etc.; 2) Algebraic, using an iterative approach (e.g. Gauss-Seidel); and 3) Algebraic, using a direct approach (e.g. Gauss-Jordan, using a matrix inverse).

In one example, a method of the present embodiment falls into the third of these classes. It can be fast (once the inverse matrix has been determined) relative to options that require iteration, and allows the least squares fit to be carried out effectively in real time. In addition, it displays deterministic behavior, which allows predictable convergence and speed under a greater variety of conditions. With iterative schemes, in contrast, it is often not possible to predict with great accuracy how long it will take for the solution to converge within acceptable error limits. Furthermore, round offs due to limited word size in the data-path hardware are minimal for this approach due to the avoidance of re-use of intermediary results. Finally, there are implementation benefits because the difficult preparation calculations (matrix inversion, etc.) can be performed offline in a large word size domain, e.g., a floating point domain, rather than having to carry out extra calculations during the actual imaging process (when the data path is already processing a large volume of data).

One facet of the present embodiment is that the matrix [K] is not square. It has a size determined by the number of spot exposures n and the number of discrete grid points at which the requested dose-map is specified (the length of column vector [D]). Therefore, it may not be possible to calculate the inverse of the matrix [K] using standard mathematical techniques. However, it is possible to proceed by calculating a "pseudo-inverse" (see, e.g., "Linear Algebra and its Applications," Third Edition, Gilbert Strang, pages 449 and 450, which is incorporated by reference in its entirety). In the description that follows, the pseudo-inverse is denoted as [K]⁺. The Moore-Penrose definition of the pseudo-inverse can be used, for example, but other analogous definitions can also be suitable.

The Moore-Penrose matrix inverse is a special case of a general type of pseudo-inverse known as a "matrix 1-inverse". It is sometimes referred to as the "generalized inverse", or simply the "pseudoinverse". The Moore-Penrose inverse [K]⁺ of a matrix [K] satisfies the following relations (for real valued matrices):

$$[K][K]^+[K]=[K],$$

$$[K]^+[K][K]^+=[K]^+,$$

$$([K][K]^+)^T=[K][K]^+, \text{ and}$$

$$([K]^+[K])^T=[K]^+[K].$$

The shortest least squares solution to the [D]=[K]·[I] (which was expressed as $\min_{I_n}\|[D]-[K]\cdot[I]\|_2$, see above) can be written in the following form: [I]=[K]⁺·[D].

If the inverse of ([K]$^T$[K]) exists, then the pseudo-inverse [K]⁺ can be expressed as:

$$[K]^+=([K]^T[K])^{-1}[K]^T,$$

where [K]$^T$ is the matrix transpose. This can be seen by pre-multiplying both sides of the equation [D]=[K]·[I] by [K]$^T$ to create a square matrix ([K]$^T$[K]), which can be inverted normally, giving:

$$[I]=([K]^T[K])^{-1}[K]^T\cdot[D]=[K]^+\cdot[D].$$

Avoiding negative intensity solutions in the direct algebraic least-squares fit, sub-spot-exposure-grid position dependence and pattern angular dependence The requested dose map (which can equal to the rasterized Flat Panel Display pattern, for example) is frequently designed to produce sharply defined resist features. The corresponding dose patterns are built up from spot 364 (which can be Gaussian shaped, for example) and fitting routines (such as the least-squares fit discussed above) will generally yield solutions with negative intensity components (i.e., spot 364 that would tend to cause a reduction in dose at points on the substrate 114/214/314 on which they fall). Unfortunately, negative contributions may not be possible in systems where neighboring spot 364 are formed incoherently (e.g., because they arrive at different times) because the associated sub-beams of radiation cannot interfere destructively with each other. The dose at a given point on the substrate 114/214/314 is then built up from a sum of intensities from different sub-beams rather than a sum of amplitudes.

The negative intensity components can be neglected (set to zero, for example) but this leads to a fit that reproduces the requested dose pattern only to a limited accuracy.

A related issue is that of unwanted position dependence in the pattern formed on the substrate 114/214/314. In particular, there is a tendency for the requested dose pattern to be more perfectly attained near to grid positions in the array of spot 364. One reason why this occurs is that errors linked to the inability to produce negative intensity are less pronounced in these regions relative to points in between the grid positions (see below). As a result of this, dense features printed at a period close to the grid period will suffer from a low frequency (the difference frequency between the period of the feature and the period of the grid) feature shape variation ("beating").

One of the effects of this sub-spot-exposure-grid position dependence is that device features will be formed differently depending on their position and/or orientation relative to the grid. For example, features with edges parallel to the grid can be formed particularly well (if the edge lies along the grid positions themselves) or particularly badly (if the edge lies exactly between rows of the grid). Features with edges at intermediate angles can be microscopically jagged.

Also, the grid of radiation spots can have a translational or rotational effect on the resulting pattern (especially an image log slope variation as a function of the position and angle with respect to the grid of radiation spots).

According to one or more embodiments of the present invention, these issues can be at least partially overcome by applying a low pass filter 508 (a two dimensional filter, for example) to the requested dose pattern data (or derivative thereof) to form a frequency-clipped target dose pattern that is fed into the inverse-optics device 512. Alternatively, the filter can be incorporated into the point-spread function matrix [K] to equivalent effect.

A low-pass filter can include any filter that completely or partially removes frequency components from a signal above a selected threshold frequency. The frequency cutoff can be sudden/sharp or gradual and the shape of the cutoff can be adjusted so as better to match the amplitude-frequency response of the requested dose map to the amplitude-frequency response of the spot exposures and/or patterning device, for example. More generally, the filter can be designed specifically to match the amplitude-frequency response of the requested dose map to the amplitude-frequency response of spot 364 and/or the patterning device.

The development and application of the filter can be described starting from the equation:

$$D(x_{MF}, y_{MF}) = \sum_{n}^{all\ exposed\ spots} I_n \cdot PSF_n((x_{MF} - x_n), (y_{MF} - y_n))$$

and transforming it into the Fourier domain. In one example, the point spread function for each of the spot 364 is a two-dimensional Gaussian (an alternative example would be an airy disc; the invention is not limited to any particular shape of spot exposure 364), defined as:

$$PSF_n((x_{MF} - x_n), (y_{MF} - y_n)) = \frac{1}{2\pi \cdot \sigma^2} \exp\left(\frac{-(x_{MLA} - x_n)^2 + (y_{MLA} - y_n)^2}{2 \cdot \sigma^2}\right)$$

or, rewritten in terms of the full-width-half-maximum $d_{fwhm}$:

$$PSF_n((x_{MF} - x_n), (y_{MF} - y_n)) =$$
$$\frac{4 \cdot 2 \cdot \ln(2)}{2\pi \cdot d_{fwhm}^2} \exp\left(\frac{-4 \cdot 2 \cdot \ln(2) \cdot ((x_{MLA} - x_n)^2 + (y_{MLA} - y_n)^2)}{2 \cdot d_{fwhm}^2}\right)$$

The Fourier transform of $$D(x_{MF}, y_{MF}) = \sum_{n}^{all\ exposed\ spots} I_n \cdot PSF_n((x_{MF} - x_n), (y_{MF} - y_n)),$$

under the above assumption is:

$$\tilde{D} = \sum_{n}^{all\ exposed\ spots} I_n \cdot \exp(-jx_n k_x - jy_n k_y) \cdot \exp\left(\frac{-(k_x^2 + k_y^2) \cdot d_{fwhm}^2}{16 \cdot \ln(2)}\right),$$

where $k_x$ and $k_y$ are the two-dimensional angular spatial frequencies and $\tilde{D}$ is the Fourier transform of $D(x_{MF}, y_{MF})$.

This last equation shows that the pattern position information is represented in the phase of $\tilde{D}$ and the shape information in the amplitude.

The spatial filter F is applied as $\tilde{F} \cdot \tilde{D}$ (i.e., a multiplication in the Fourier domain). The operation can also be viewed as a convolution between a corresponding non-Fourier transformed filter F and $D(x_{MF}, y_{MF})$.

The filter should not influence the pattern position information. Therefore, the filter should be chosen to have a linear phase behavior. For example, symmetrical FIR (Finite Impulse Response) filters (for the purposes of this application, a convolution with a symmetrical shape is considered to fall within this class), which have a suitable linear phase behavior, can be used. Any resulting phase effect of such filters can be made zero by applying an additional translation.

The filter should not normally affect the size/dose of the pattern shapes, so the DC filter gain is normally chosen to be 1.

As discussed above, one of the issues with the amplitude-frequency response of the spot 364 is that it is not possible to create negative light (i.e. negative amplitudes) with incoherent imaging (although this is possible with coherent imaging). A further issue is that the frequency response of the spot 364 varies according to the position of the pattern with respect to individual spot exposure grid positions (i.e., this is one cause of the sub-exposure-grid position dependence mentioned above). This means that a filter designed to work for dose pattern elements in one part of the sub-exposure-grid may not work as effectively for dose pattern elements defined at other positions in the sub-exposure-grid.

The extent to which sub-exposure-grid position dependence is an issue will, in general, depend on the nature of the spot exposure grid. The rectilinear nature of device elements, for example, means that square/rectangular spot exposure grids (where a unit cell with square or rectangular symmetry can be identified) are more likely to suffer due to the increased likelihood of device elements or edges lying along "worst case" lines in the exposure grid (see below for what is meant by "worst case"). In such a scenario, it is desirable to configure the filter 508 to cope with "worst case" points in the sub-exposure-grid. On the other hand, the effect of sub-exposure-grid variation on device structures in other exposure grid geometries (such as hexagonal or quasi-hexagonal, for example) can tend to average out so that a lighter filter can be used, configured to cope merely with an average rather than a "worst case" position. By quasi-hexagonal geometry, what is meant is an arrangement derivable by a simple scaling along x and/or y from pure hexagonal geometry (pure hexagonal geometry being defined as a grid geometry that can be built up from unit cells with hexagonal symmetry—similar to a 2D "close-packed" structure). In general, the appropriate strength of the filter 508 will depend on the particular spot exposure grid geometry.

According to one example, a filter 508 is developed based on the Fourier transform of the spot exposure grid impulse response (this refers to the response of the spot exposure grid to a requested dose pattern consisting of a Dirac delta-function at a particular point). In general, one or more spots will be used to image the impulse, the number depending on the sub-exposure-grid position and exposure grid geometry, as discussed further below.

Figure 6:
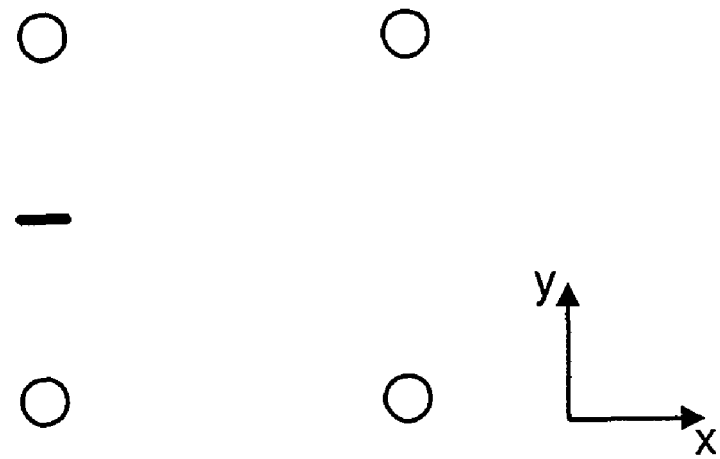
FIG. 6 depicts a portion of a square spot exposure grid and a "worst case" position, according to one embodiment of the present invention.
Figure 7:
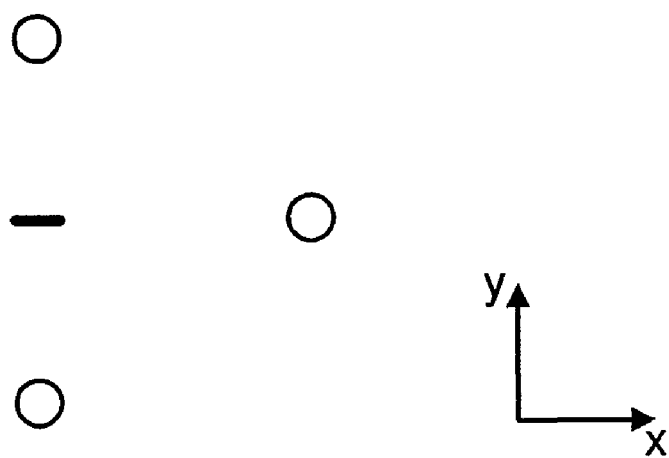
FIG. 7 depicts a portion of a hexagonal spot exposure grid and a "worst case" position, according to one embodiment of the present invention.

FIG. 6 depicts a portion of a square spot exposure grid and a "worst case" position, according to one embodiment of the present invention. FIG. 7 depicts a portion of a hexagonal spot exposure grid and a "worst case" position, according to one embodiment of the present invention. Thus, FIGS. 6 and 7 show example grid geometries (rectangular and hexagonal respectively). For a rectangular grid, at most four spot exposures are used to expose an impulse response. For a hexagonal grid, at most three spot exposures are used to expose an impulse response. In each case, the actual number will depend on the sub grid position at which the impulse response is requested.

The generalized Fourier transform of the impulse response for a grid (assuming a Gaussian spot shape) is $$\tilde{H} = \sum_{n}^{all\ exposed\ spots} I_n \cdot \exp(-jx_n k_x - jy_n k_y) \cdot \exp\left(\frac{-(k_x^2 + k_y^2) \cdot d_{fwhm}^2}{16 \cdot \ln(2)}\right),$$

where $k_x$ and $k_y$ are the two-dimensional angular spatial frequencies, $d_{fwhm}$ indicates the full width half maximum of the spot 364, $I_n$ indicates the spot exposure intensity of spot n, and $x_n$ and $y_n$ indicate the spot exposure position of spot n.

If an impulse response is requested exactly on a grid position, it is to activate one spot exposure 364 in order to expose it. This is referred to as a "best case." The Fourier transform of this best case impulse response of a spot exposure grid is:

$$\tilde{H}_{best\ case} = \exp\left(\frac{-(k_x + k_y) \cdot d_{fwhm}^2}{16 \cdot \ln(2)}\right)$$

A so-called worst case situation arises for a requested impulse exactly half-way between two exposed spots (both hexagonal and rectangular). Examples of these positions (indicated by "−") are given in FIGS. 6 and 7. The 1-dimensional Fourier transform of this worst case impulse response (taken along the worst case trajectory, $x_n=0$) is as follows:

$$\tilde{H}_{worst\ case} = \frac{1}{2} \cdot \exp(-j \cdot 0.5 \cdot k_y p + j \cdot 0.5 \cdot k_y p) \cdot \exp\left(\frac{-(k_x^2 + k_y^2) \cdot d_{fwhm}^2}{16 \cdot \ln(2)}\right)$$

where p indicates the spot exposure grid pitch.

Figure 8:
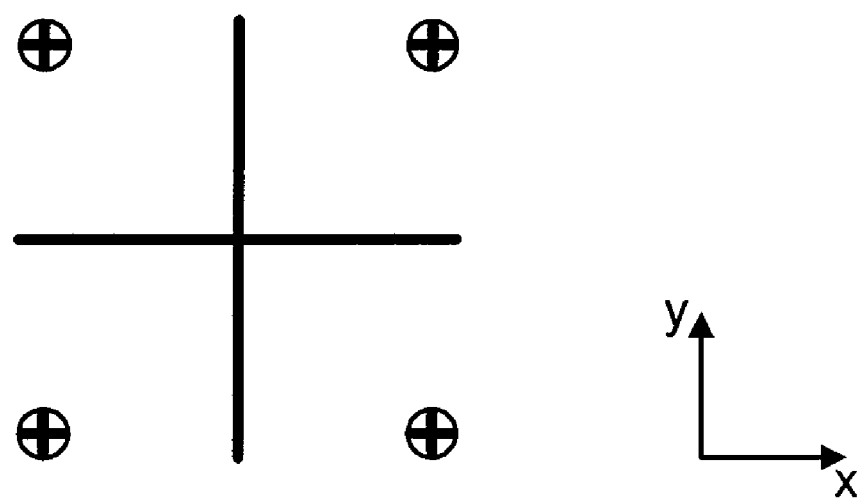
FIG. 8 depicts a portion of a square spot exposure grid with "worst case" lines and "best case" positions, according to one embodiment of the present invention.
Figure 9:
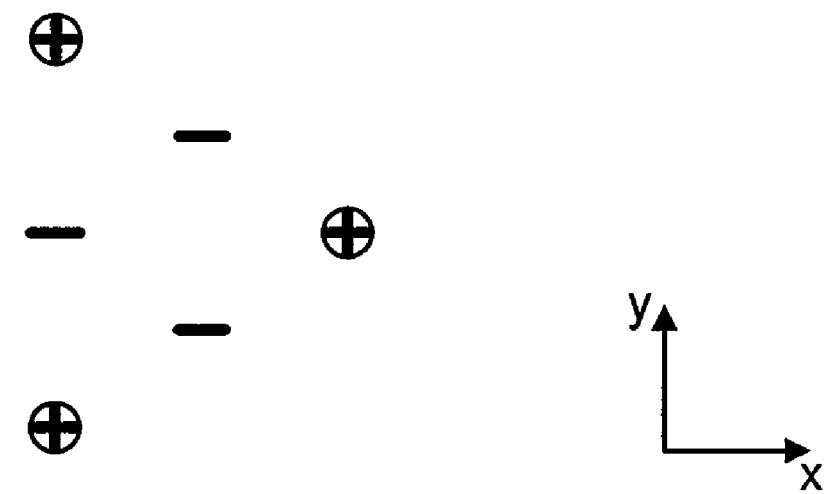
FIG. 9 depicts a portion of a hexagonal spot exposure grid with "worst case" positions and "best case" positions, according to one embodiment of the present invention.

FIG. 8 depicts a portion of a square spot exposure grid with "worst case" lines and "best case" positions, according to one embodiment of the present invention. FIG. 9 depicts a portion of a hexagonal spot exposure grid with "worst case" positions and "best case" positions, according to one embodiment of the present invention. FIGS. 8 and 9 show how worst case ("−") and best case ("+") positions are distributed in the rectangular and hexagonal grid geometries, respectively. As can be seen, in the case of the hexagonal spot exposure grid, discrete points exhibit the worst case impulse response behavior under specific angles. In the case of the rectangular spot exposure grid, worst case points lie along continuous lines covering the entire substrate. These lines lie at specific, but very common device feature angles. It can be seen that, in a rectangular grid, the number of positions (statistically) of the worst case impulse response far exceeds the number of similar positions in the hexagonal spot exposure grid. Therefore, the average performance of the hexagonal grid from this point of view is likely to be better than that of the rectangular spot exposure grid. This improvement is relevant for the system behavior, which is determined by, amongst other things, the low-pass fit filter 508 described above.

An exemplary discussion of best and worst case scenarios for rectangular and hexagonal spot exposure grids can be found in U.S. Ser. No. 11/018,929, filed Dec. 22, 2004, which is incorporated by reference herein in its entirety.

The low pass fit filter 508 can be applied for various reasons, for example, (1) to avoid the need for negative light; (2) to minimize the influence of the sub-spot-exposure-grid position; and (3) to minimize the influence of the angle between an image feature and the spot exposure grid on the resulting aerial image. It is found that for a hexagonal spot exposure grid, higher spatial frequencies can be allowed to enter the fitting algorithm of the inverse-optics device 512 without increasing the maximum negative solution with respect to the case in which a rectangular spot exposure grid is used.

In one example, the filter 508 is configured to operate in a circularly symmetric manner (with respect to radial axes lying in the plane of the substrate) and matches the worst-case spot exposure grid impulse response. The extent to which it is used to allow for the worst-case impulse response can depend on the shape of the grid. In grids where worst case points lie at discrete grid positions (rather than along lines), it can be sufficient for a weaker filter to be used. With different shaped grids it can be more effective to choose an intermediate position (relative to the worst and best case positions), particularly where the worst case points line at discrete positions (rather than along lines).

The filter 508, according to this example, is also designed so as simultaneously to maximize the performance of the pixel grid imaging in terms of the CD, CDU and dose uniformity (by removing just enough of the higher frequencies to solve the abovementioned s and, ideally, no more).

Rectangular Spot Exposure Grid Filter

As mentioned above, the 1-dimensional Fourier transform of the worst case impulse response can be written as:

$$\tilde{H}_{worst\ case} = \frac{1}{2} \cdot \exp(-j \cdot 0.5 \cdot k_y p + j \cdot 0.5 \cdot k_y p) \cdot \exp\left(\frac{-(k_x^2 + k_y^2) \cdot d_{fwhm}^2}{16 \cdot \ln(2)}\right)$$

where p indicates the spot exposure grid pitch. The magnitude of this worst case impulse response described by the above equation becomes negative at $k_y=\pi/2$ so that a filter with low-pass properties, such as to suppress spatial frequencies greater than this value will avoid negative amplitudes. If the filter 508 is strong enough to cope with the worst case grid points, then it will also be sufficient to avoid negative amplitudes for other positions in the sub exposure grid. Using a stronger filter 508 (e.g., with a cut-off at an even lower frequency) will unnecessarily degrade the performance of the spot exposure grid and lead to a dose pattern of reduced resolution.

Following on from the above discussion, a suitable filter can be a two-dimensional circularly symmetrical FIR filter, based on the following one-dimensional truncation:

$$\tilde{F}_{fit\ filter, rect} = \begin{cases} |\tilde{H}_{worstcase}(k_x = 0, k_y = \omega)| & when\ \omega < \frac{\pi}{p} \\ 0 & when\ \omega \geq \frac{\pi}{p} \end{cases}$$

where $\omega=\pi/p$ is the one-dimensional angular spatial frequency corresponding to the spot exposure grid pitch.

Hexagonal Spot Exposure Grid Filter

Figure 10:
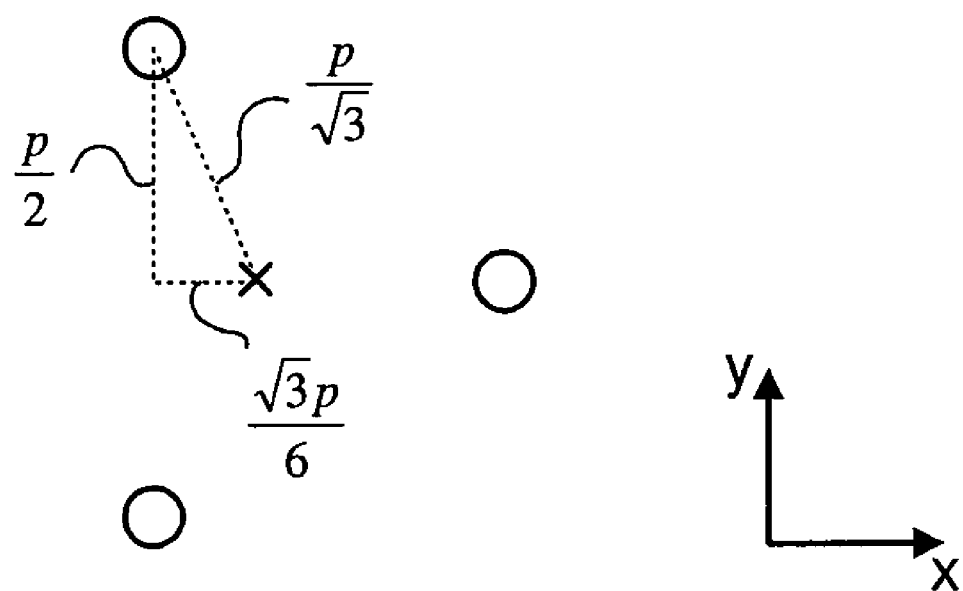
FIG. 10 depicts the hexagonal spot exposure grid geometry and shows an "intermediate case" position, according to one embodiment of the present invention.

FIG. 10 depicts the hexagonal spot exposure grid geometry and shows an "intermediate case" position, according to one embodiment of the present invention. The filter for this geometry of exposure grid can be developed starting from the Fourier transformed impulse response for a position exactly in between three spots. The position shown in FIG. 10 represents the intermediate position between the worst and best cases (see FIG. 9). The Fourier transformed impulse response of the central position shown is:

$$\tilde{H}_{central;hex} = \frac{1}{3} \cdot \left\{ \exp\left(-j\frac{1}{\sqrt{3}} \cdot p \cdot k_x\right) + \exp\left(j\frac{\sqrt{3}}{6} \cdot p \cdot k_x - j\frac{1}{2} \cdot p \cdot k_y\right) + \exp\left(j\frac{\sqrt{3}}{6} \cdot p \cdot k_x + j\frac{1}{2} \cdot p \cdot k_y\right) \right\} \cdot \exp\left(\frac{-(k_x^2 + k_y^2) \cdot d_{fwhm}^2}{16 \cdot \ln(2)}\right)$$

where p indicates the spot exposure grid pitch.

A suitable filter in this case can be a two-dimensional circularly symmetrical FIR filter, based on the following one-dimensional truncation:

$$\tilde{F}_{fit\;filter;hex} = \begin{cases} |\tilde{H}_{worstcase}(k_x = 0, k_y = \omega)| & \text{when } \omega < \frac{4\pi}{3p} \\ 0 & \text{when } \omega \geq \frac{4\pi}{3p} \end{cases}$$

where $\omega = 4\pi/3p$ is the one-dimensional angular spatial frequency corresponding to 0.75 times the spot exposure grid pitch.

For both the rectangular and hexagonal spot exposure grid filters 508 discussed above, the fitted solution provided by the inverse-optics device 512 does not use large negative exposed spot intensities in order to image the requested dose map to a high level of precision. In fact, a typical solution will contain only very small negative exposed spot intensities, which can be clipped to zero. In one example, small "stray" positive values, arising as a side effect from the filtering process, can also be clipped to zero—these can otherwise lead to small but significant amounts of "stray light" in areas far away from the edges of pattern features. The effect of this clipping results in some very faint dose intensity in small parts of a region neighboring an image feature where no light has been requested. These positions are typically located within a band of around 1.5 microns from the actual edge, so that the influence on the device to be formed can normally be neglected.

In general, the low pass filter could be arranged to operate either partially or completely in an offline part of the datapath, after rasterization, or as a part of the rasterization process. In addition, although the above embodiments refer to a direct algebraic least-squares fit of the spot exposure intensities to the frequency-clipped target dose pattern, it would also be possible to adapt the use of the low-pass filter to the case where an indirect/iterative approach is used.

An Image Sharpening Filter

Figure 11:
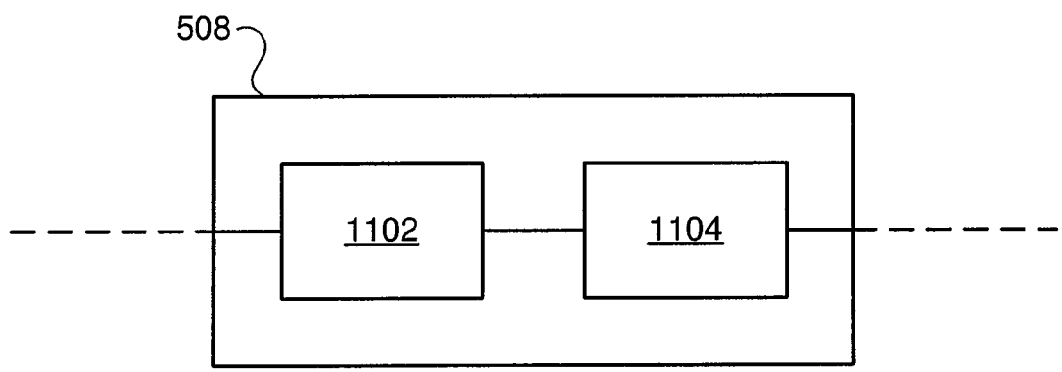
FIG. 11 depicts a low-pass and sharpening combination filter, according to one embodiment of the present invention.

FIG. 11 depicts a low-pass 1102 and sharpening filter 1104, according to one embodiment of the present invention. FIG. 11 shows an alternative embodiment of the invention in which the filter 508 has a split or dual functionality, comprising a low pass filter part 1102 and a sharpening filter part 1104. The sharpening filter 1104 can be used to improve the definition of features in the dose pattern, making use of the knowledge of the product features to be formed. In general, the sharpening filter 1104 will comprise a contribution corresponding to the inverse of the image feature to be sharpened (in the Fourier domain). Taking as an example the smallest possible circular product feature (with a diameter equal to the critical dimension CD), the sharpening filter function can be defined as follows in the spatial domain:

$$H = \begin{cases} \frac{1}{\pi \cdot R_{sharp}^2} & \text{when } \sqrt{x^2 + y^2} \leq R_{sharp} \\ 0 & \text{when } \sqrt{x^2 + y^2} > R_{sharp} \end{cases}$$

where $R_{sharp}$ is the radius of the image feature (here, half the CD). Transforming the image feature into the Fourier domain yields $$\tilde{H} = 2 \cdot \frac{J_1 \cdot \left(R_{sharp} \cdot \sqrt{k_x^2 + k_y^2}\right)}{R_{sharp} \cdot \sqrt{k_x^2 + k_y^2}}$$

where $J_1$ is a Bessel function of the first kind.

The sharpening filter 1104 corresponding to this example is then the inverse of the amplitude frequency response of the Fourier transform of the smallest possible circular symmetrical image feature:

$$\tilde{F}_{sharp\;filter} = \begin{cases} \left|\frac{\omega \cdot R_{sharp}}{2 \cdot J_1(\omega \cdot R_{sharp})}\right| & \text{when } \omega \leq \frac{\pi}{p} \\ \tilde{F}_{sharp\;filter}\left(\omega = \frac{\pi}{p}\right) & \text{when } \omega > \frac{\pi}{p} \end{cases}$$

A Filter for Controlling the Image Log Slope

Figure 12:
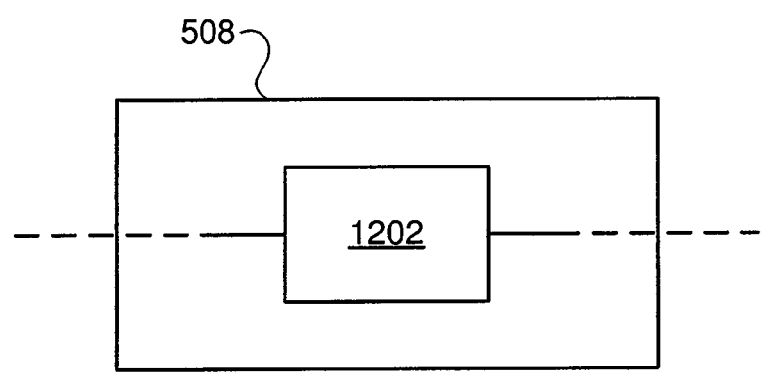
FIG. 12 depicts an image log slope filter, according to one embodiment of the present invention.

FIG. 12 depicts an image log slope filter, according to one embodiment of the present invention. The "image log slope" refers to the spatial dependence of the dose pattern written to the substrate and in particular to the rate of change (or slope) of dose with distance dI/dx. It can be useful for a user of the lithography machine to be able to adjust this slope for several reasons. Firstly, a shallower image log slope means that features formed after substrate processing will tend to have more rounded edges, which can reduce the risk of electrostatic discharge (sparks). Secondly, a shallower slope can make it easier to achieve satisfactory overlap between features on different process layers on the substrate. Overlap generally has to be controlled with greater precision where features themselves are sharply defined in any one process layer (i.e., having a steep image log slope). Thirdly, in flat panel displays produced by lithography, for example, the viewing angle is dependent on the image log slope of individual features. A shallower image log slope can lead to a larger viewing angle (perhaps at the expense of resolution, contrast ratio, etc.), which can be desirable for certain applications (e.g., in television or video).

The filter 508 can comprise an image log slope filter 1202 for this purpose. It is not generally possible in this way to adjust the contrast above the maximal contrast determined by the worst case spot exposure impulse response, so the filter will normally act to reduce the contrast.

An example image log slope filter function in the spatial domain is:

$$F_{slope} = \begin{cases} \frac{1}{\pi \cdot R_{slope}^2} & \text{when } \sqrt{x^2 + y^2} \leq R_{slope} \\ 0 & \text{when } \sqrt{x^2 + y^2} > R_{slope} \end{cases}$$

The filter function is determined such that the DC gain of the filter is 1. The radius $R_{slope}$ is the parameter that influences the image log slope.

Alternatives to Filters

In one example, as an alternative to manipulating the control signal to be sent to the patterning device 104/204 using filters, it can also be possible to modify the illumination and projection optics in order to change the spot shape. Different spot shapes can be realized by beam shaping and stops. Spot shapes realized can be, for example: a Gaussian beam (in case of multiple laser beam propagation), an airy disk (by a truncating aperture), a circular tophead light distribution or a convolution of any of the above.

In one example, filters can provide a cheaper and more easily adaptable solution because they do not require major additions of new types of hardware. Instead, an increase in the capacity of existing hardware and/or reconfiguration can be sufficient.

Combining Filters

In one example, it is possible to produce a combined filter that performs the functions of two or more of the filters discussed above. In the case where the combined filter is formed from the low pass filter 1102, sharpening filter 1104 and image log slope filter 1202, the combined filter in the spatial domain is formed by a convolution as follows:

$$F_{combined\ filter} = F_{fit\ filter} \otimes F_{sharp} \otimes F_{slope}$$

where $\otimes$ represents "convoluted with" (both here and throughout the specification). As the convolution operation satisfies the property $f \otimes g = g \otimes f$, the order in which the filters are combined does not make any difference.

In one example, the filters thus defined (combined with each other or otherwise) can also be combined with the pseudo-inverse matrix $[K]^+$ (instead of using a separate filter step that filters the requested dose $[D]$) as follows:

$$[I] = F_{combined\ filter} \otimes [K]^+ \cdot [D],$$

which results in $$[I] = [K]^+_{filtered} \cdot [D].$$

Filtering the kernel $[K]^+$ and not the requested dose $[D]$ can have the following attributes: a) the dynamic range of the kernel is reduced (kernel values are smeared out), which reduces the word size; and b) the context radius is reduced (for a similar imaging performance) substantially.

In one example, the filtered kernel $[K]^+_{filtered}$ can be prepared completely off-line. At least, this is true to the extent that: the MLA spot positions do not vary during a single substrate exposure; the MLA point-spread function shape does not vary; the MLA position variation can be compensated in the data-path; and the scan speed and laser frequency are constant.

Filters for Applying CD Biasing

In one example, critical dimension biasing (CD biasing) is used. CD biasing is concerned with the step of adjusting the minimum line width according to customer needs. This step is frequently used because, while the line width of the dose pattern can be predictable to a high degree, the actual line width of the feature formed after processing is less predictable and can benefit from adjustment in order to achieve optimal performance. This adjustment can be implemented by biasing the CD (i.e., increasing the CD to form thicker lines or decreasing the CD to form thinner lines).

In mask-based lithographic systems, CD biasing is normally achieved by changing the overall intensity of the radiation source. An increased intensity for each sub-beam of radiation tends to spread out the dose associated with individual pattern features, which leads to a changed CD (CD increase is applicable to clear aerial images, CD decrease is applicable to dark aerial images—bright field)). This and similar approaches have the drawback that a change in CD induced along one axis parallel to the substrate can be accompanied by a corresponding change in CD along the orthogonal axis. This limitation is not a problem if the customer requires equal adjustment along both the X and Y axes, but a higher level of optimization would generally be possible if the CD could be adjusted independently for each axis (e.g., change the CD along X, but not Y). More importantly, it would be preferable to adjust sizes and densities on a feature-by-feature basis, for a sub-set of, or for all, feature types (e.g., dense, isolated, lines, contacts etc.).

Figure 13:
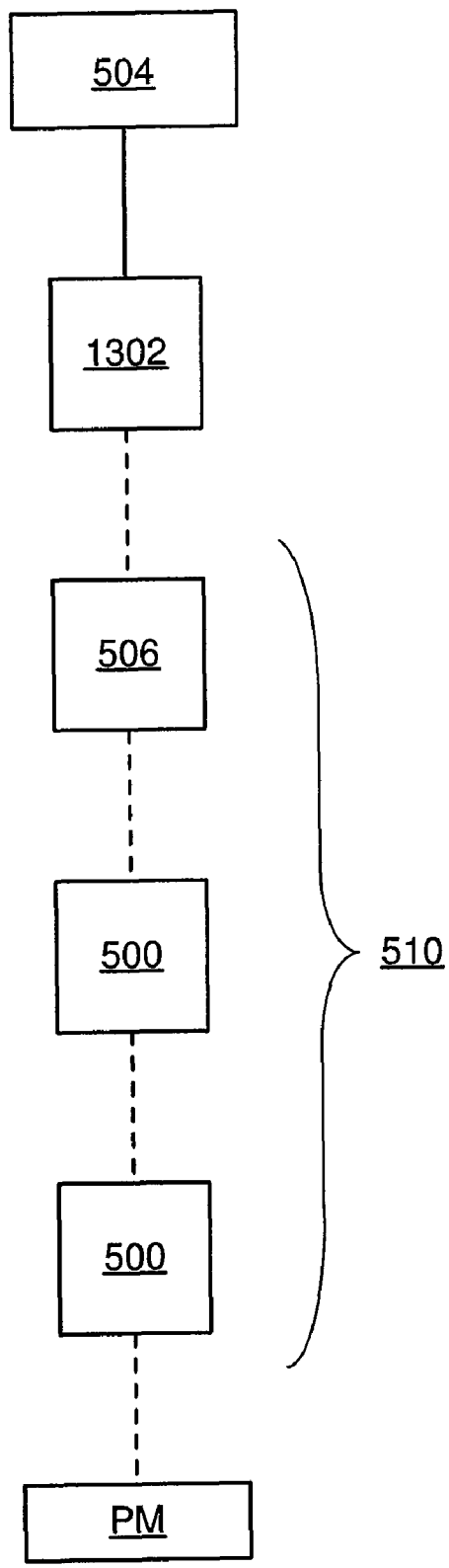
FIG. 13 depicts a CD biasing filter, according to one embodiment of the present invention.

FIG. 13 depicts a CD biasing filter 1302, according to one embodiment of the present invention. Independent X and Y CD biasing is performed by providing CD basing filter 1302 to manipulate the control signal sent to the patterning device 104/204, rather than the illumination dose, to change the CD. This method can also be used to provide a CD that varies with position (and, possibly, independently in X and Y) over the substrate 114/214/314. This can be achieved through the use of a CD biasing filter 1302 in an analogous way to the filters discussed above. In particular, the CD biasing filter 1302 can be used to modify the requested dose map data to be input to the data manipulation device 500 (two such devices are shown for illustrative purposes). This filtering operation would normally be arranged to be carried out off-line as it can be difficult to implement such functionality in the fitting algorithm itself (as performed by the inverse-optics device 512). In this example, the CD biasing filter 1302 is positioned before the rasterizer 506. In one example, if inline control is used, this can still be achieved (as in mask-based systems), possibly in combination with the offline method discussed above, by varying the intensity of the radiation source, for example, or using a dilation/erosion algorithm (see above).

Alternatively or additionally, CD biasing can be applied using the mathematical morphology operations known as dilation and erosion. The dilution operation can be applied to a mathematically defined object to cause it to dilate, or grow in size, while erosion causes objects to shrink. The amount and manner in which the objects are caused to grow or shrink is specified by a so-called structuring element. This method can be applied digitally either inline or offline.

On-the-Fly Focus Correction

Focus correction can be achieved by varying the position of the substrate table WT 106/206, in response to measurements of the best focus position, as the substrate table WT 106/206 is moved relative to the substrate 114/214/314. In principle, all or part of the projection system 108/208 can also be moved to achieve the same effect. In either case, both translation and rotational (tilt) displacements can be used.

Systems such as these are expensive in terms of servos and the extra control systems that are used for an efficient implementation. In addition, the spatial resolution of the focus correction is limited at best by the size of the spot grid associated with a given MLA and optical column. Sub-sections of the optical column and/or substrate table 106/206 cannot normally be moved independently with respect to each other and the substrate 114/214/314. In addition, there is a limit to how quickly such systems can respond to changes in the best focus position due to the inertia of the component that is to be displaced.

In one example, best focus is performed via a data-path (i.e., by manipulating the control signal to be fed to the patterning device 104/204). This is possible because the focus influences the full width half maximum of the point spread functions for each spot exposure 364. Calculations based on measurements of the true focus position relative to particular points on the substrate 114/214/314 can be input as calibration data into the point spread function matrix [K]. The control signal sent to the patterning device 104/204 can thus be adapted to take account of out-of-focus regions on the substrate 114/214/314 where the spot exposure shape will be slightly wider than normal. The result of such spot correction is that focus can effectively be achieved to a higher degree. This is due partly to the increased spatial resolution (limited by the size of individual spot exposures rather than the size of the whole spot grid) and partly by the quicker response time (no extra mechanical movement is performed). This can be achieved adding any major new hardware (such as servo/control systems), although additional computational hardware can be used to add the extra capacity in the data-path 510. In one example, focus control in this way can allow a mechanical focus control apparatus to be removed or simplified, thus reducing costs and/or space. Alternatively, a high resolution system can be devised using a combination of mechanical focus control (as a "coarse" adjustment) and data-path focus correction (as a "fine" control). Coarse and fine adjustment can refer to predominantly low spatial frequency and predominantly high spatial frequency correction respectively.

In one example, the correction applied by the data-path can take into account effects that remain constant from scan to scan, for example focus variations from lens to lens in the MLA. In this scenario, the correction can be implemented via offline calculations and an offline adjustment to the point spread function matrix [K] to be used by the inverse-optics data manipulation device 512. However, the correction can also be applied in-line to provide an "on-the-fly" correction for effects that can vary from scan to scan, such as those associated with imperfections in the substrate topology or in the substrate table transport.

Figure 14:
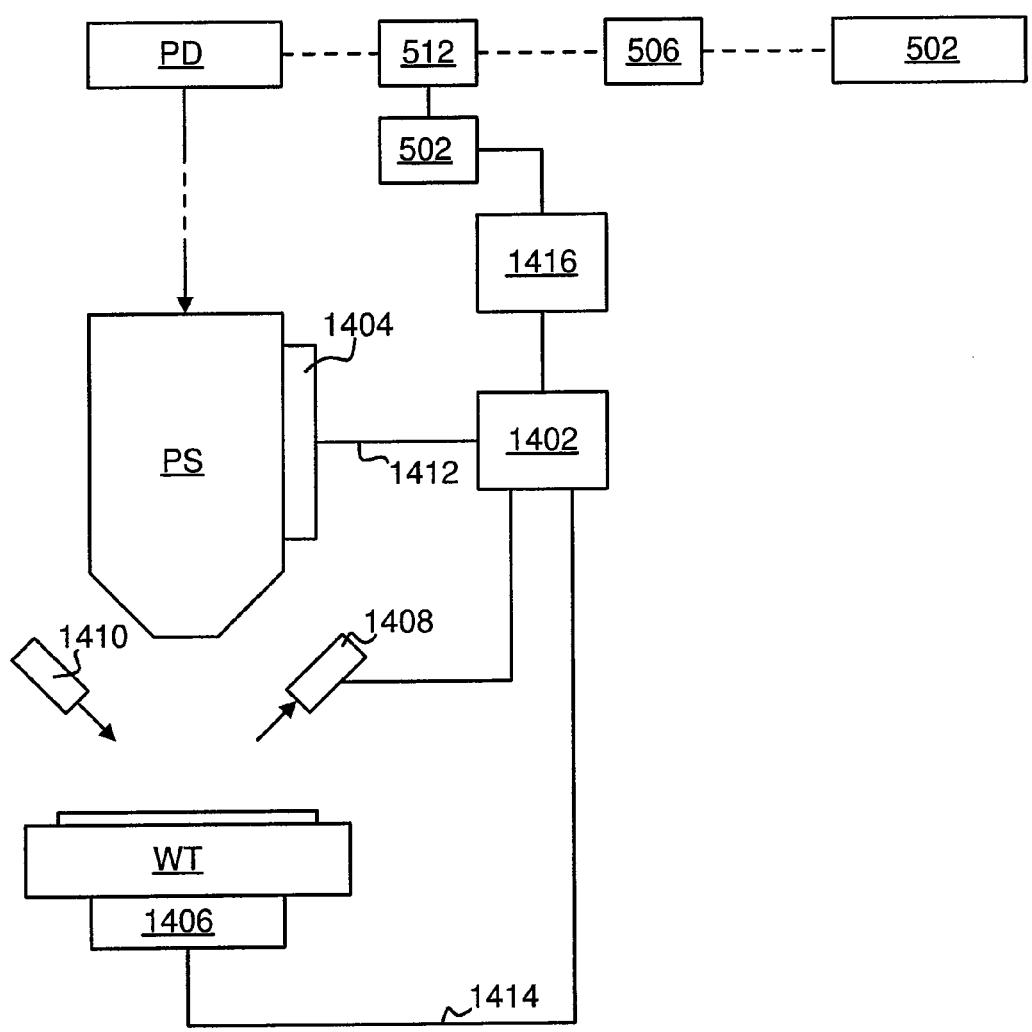
FIG. 14 depicts an apparatus suitable for on-the-fly focus correction via a data-path, according to one embodiment of the present invention.

FIG. 14 depicts an apparatus suitable for on-the-fly focus correction via a data-path, according to one embodiment of the present invention. This embodiment can also use coarse and fine control discussed above. Focus data is obtained by analyzing radiation from a radiation source 1410, which is received, after reflection from various positions on the substrate 114/214/314 and/or substrate table 106/206, by a radiation detector 1408. This analysis can be carried out by a focus control device 1402. Alternatively, the position of the substrate table 106/206 and substrate 114/214/314 can be determined at various points by measuring the travel times of ultrasonic waves emitted by one or more ultrasonic transducers rigidly attached to the projection system 108/208 after reflections from the substrate 114/214/314 and/or substrate table 106/206.

Based on the focus data thus obtained, the focus control device 1402 calculates a best focus position for a portion of the substrate 114/214/314 and outputs a control signal along either or both of data pathways 1412 and 1414 to either or both of a projection system position and/or tilt controller 1404 and a substrate table position and/or tilt controller 1406. The projection system position and/or tilt controller 1404 and/or substrate table position and/or tilt controller 1406 are thus caused to perform translation and/or tilt operations of the projection system 108/208 and/or substrate table WT 106/206 in order to bring the region at the substrate 114/214/314 to be exposed into a position closer to the best focus plane. According to this embodiment, this is the so-called "coarse" control.

Fine control is achieved via the data-path 510. The focus control device 1402, after forwarding the control signal to the controllers 1404 and 1406, is configured also to forward focus data to a data-path focus control device 1416, which calculates the adjustments that need to be made to the matrix [K] in order to take account of changes in the point spread function performance that should be expected due to variations in the quality of the focus.

In one example, the combination of coarse and fine correction can be implemented in the following sequence: measure focus; carry out coarse correction; re-measure focus; carry out fine correction. In this sequence, the focus data sent to the coarse device will be different from that sent to the fine correction device each time (assuming some focus error is always detected). Alternatively, the coarse and fine correction can be carried out simultaneously. In this case, the data sent to the data-path focus control device 1416 includes the control signal sent to the controllers 1404 and 1406. The correction to the matrix [K] will then take account of the expected movement(s) of the substrate table 106/206 and/or projection system 108/208. The relationship between values of a control signal sent to one or both of controllers 1404 and 1406 and the resultant changes in focus can be recorded in a calibration table.

In the embodiment shown, the focus correction data is passed to the data-path via the storage device 502 which provides the spot position and spot point spread function information (which can be updated by the focus correction data) to the inverse optics data manipulation device 512. The correction data can also be incorporated at other in-line points in the data-path without departing from the scope of the invention Correct Intensity Non-Uniformity in Data-Path Each element in the array of individually controllable elements can be activated to a state that depends on a control voltage. Where the elements in question consist of mirrors, the activation can take the form of a tilt about an axis in the plane of the mirror. The activation state would then correspond to a particular angle of tilt. The activation state can also be referred to as a reflectivity set-point, for example, where elements of variable reflectivity (in a given direction) are used in the array of individually controllable elements. The intensity of radiation in a sub-beam of radiation that has been patterned by one or more of these elements depends on the activation state of the element(s) concerned. The conversion between an intensity and a control voltage can be implemented as a two-stage process. In a first stage, a multiplication operation is performed to convert intensities to corresponding activation states (e.g., reflectivities). The second stage is then concerned with selecting appropriate control voltages in order to obtain these element activation states from the array 104/204. The relationship between the control voltage and the resulting element activation state is not in general of a simple linear form, and a calibration table (e.g., look-up table) is normally provided to enable this conversion to be carried out. Interpolation can be used to convert values lying between discrete points in the calibration table. Alternatively, a mathematical function (e.g., a Chebyshef polynomial) can be fitted to all or a portion of the data in the calibration table and conversion can be carried out using the resulting fitting function.

In one example, the overall conversion is carried out via "inverse-patterning-device" data manipulation device 514.

This can comprise a multiplier 516 (for performing stage 1 conversion—from spot intensity to element activation state or reflectivity set-point) and a lookup table device 518 (for performing stage 2 conversion—from element activation state or reflectivity set-point to element control voltage), as discussed in reference to FIG. 5 above.

In one example, intensity non-uniformity can occur independently of the properties of the array of individually controllable elements due to a variety of optical effects within the apparatus. The result can be unwanted intensity variations between individual spot exposures, individual optical columns, individual laser systems, etc. In principle, these variations can be taken into account by incorporating extra calibration information into the requested dose data sent along the data-path. Although potentially effective for removing the intensity variations, this kind of approach can result in an undesirable increase in the data-path internal dynamic intensity range to be able to cope. This can lead to an increase in costs.

In one example, the inverse-patterning-device data manipulation device 514 is adapted to at least partially correct for intensity non-uniformity. For example, calibration measurements can be used to establish a new look-up table for device 518 that takes into account not only the properties of the patterned device 104/204, but also factors contributing to intensity non-uniformity. These calibration measurements can be carried out in a fully assembled machine (i.e., where all intensity influencing factors are active). For example, the system can be equipped with one or more dose sensors, both to measure the source intensity and the spot intensity. The ratio of the two quantities is related to the intensity non-uniformity. Furthermore, a spot sensor can be included at substrate level that can measure the spot alignment position (s). Alternatively or additionally, substrate base techniques can be used, which consist in printing a pattern (or an individual spot) and then deriving intensity non-uniformity characteristics using offline tooling. Once the non-uniformity characteristics have been established standard interpolation schemes can be used to calculate the new look-up table values.

As an alternative to adjusting the lookup table values in device 518, intensity non-uniformity correction can be implemented by manipulating properties of the multiplier 516. For example, the gain (or gains) can be varied to take account of non-uniformity effects.

Correcting for intensity non-uniformity at this late stage in the data-path reduces the requirement for increased bandwidth/dynamic range at earlier stages in the data-path. This example can also help to reduce rounding errors.

Avoid Performing Calculations for Values that are Either Totally Black or White

In one example, an image processing algorithm, such as those performed by the inverse-optics device 512, performs matrix multiplications. The hardware used to carry out these multiplications is specifically tailored to the type of calculation to be carried out, so it optimized to achieve an optimal number of MACs (Multiply Accumulates) per second. The hardware in question (which can be a DSP or a more general CPU) comprises one or more FPGAs (Field Programmable Gate Arrays) with a multiplication section that can be built up from multiplication units specially constructed to carry out MAC operations. Because the details of the image to be processed is not known in advance. The hardware is normally designed to be able to cope with non-zero values at each of the grid positions defining the image. This requires a large number of MACs, and therefore expensive hardware.

In lithographic applications, such as the inverse-optics device 512, most of the terms in the requested dose pattern vector [D] will be 0 or 1 or, where grey tone imaging is used, 0 and 15, corresponding to the absence or presence of a feature. The MAC operation for these can be relatively simple (e.g., no real multiplication is performed). In one example, the MAC either outputs a zero or a multiplication coefficient, which can be shifted a number of places to the left and padded with zeros at the least significant side. Only the edge regions of the device elements in the image consist of grey values for which a true multiplication is performed. The black and white regions may not use the full functionality provided by the multiplication units.

In one example, a dedicated pre-processor is provided in the FPGA before the multiplying stage, which is capable of identifying and handling black and white areas in the requested dose map. The multiplying section uses a reduced input consisting predominantly of the grey areas in the requested dose map, which may not use the full functionality of the multiplication units. This arrangement allows the number of MACs per second (and therefore the cost) to be greatly reduced without having a significant negative effect on the image processing performance.

Figure 15:
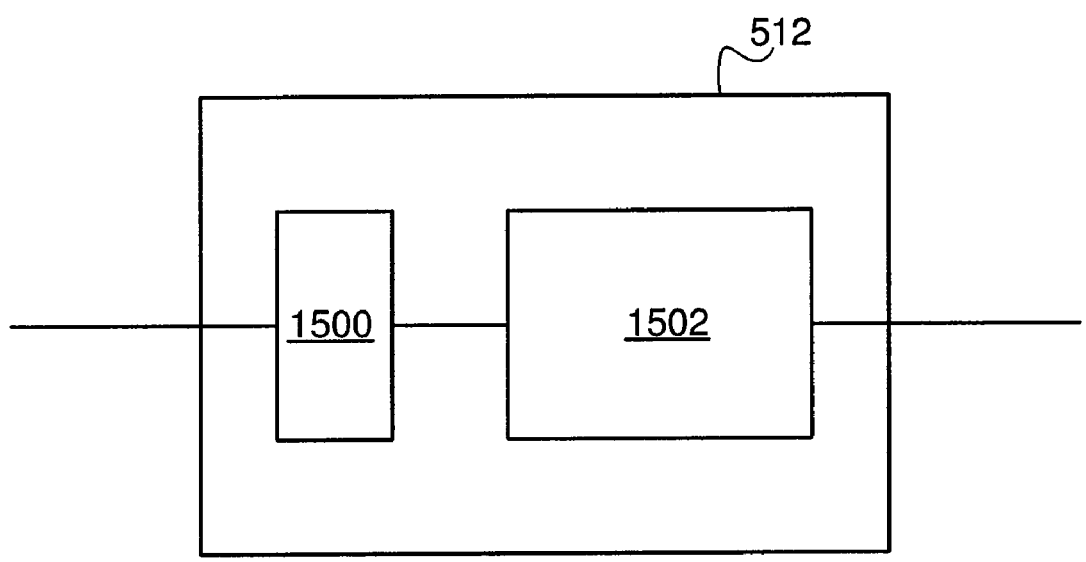
FIG. 15 depicts a multiplication stage with a preprocessor for reducing calculation load, according to one embodiment of the present invention.

FIG. 15 depicts a multiplication stage with a preprocessor 1500 for reducing calculation load, according to one embodiment of the present invention. As mentioned above, the preprocessor 1500 can also be formed as an integral part of the FPGA.

Ghost Light Suppression

In one example, ghost light can be produced, which is unwanted or stray light that manages to reach the substrate 114/214/314. This can arise, for example, via internal reflection within the system optics and/or via cross-talk between neighboring MLA spots. Optical elements of the lithographic apparatus are normally designed to avoid this as much as possible, but it is extremely difficult to remove entirely.

In one example, using a direct least squares fit of the requested dose pattern to the array of spot exposures, ghost light can be corrected for by incorporating terms into the point-spread-function matrix $[K]^+$. In the case where neighboring spot exposures can be imaging coherently, it is possible to correct for the stray light to a very high level. Where neighboring spot exposures are exposed at different times, a lower level correction can be achieved. This method does not use additional non-zero terms in the matrix $[K]^+$, which leads to additional multiplies and accumulates in the data-path. This can result in a somewhat higher cost, but this can be offset on the one hand by potentially higher quality images or, on the other, by reduced costs in the optical system design (since less expense needs to be dedicated to avoiding ghost light suppression if it can be compensated.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography apparatus, comprising:
a projection system configured to project a beam of radiation onto a substrate as an array of sub-beams of radiation;
a patterning device configured to modulate the sub-beams of radiation to substantially produce a requested dose pattern on the substrate, the dose pattern being built up from an array of spot exposures in which at least neighboring ones of the spot exposures are imaged incoherently with respect to each other and each of the spot exposures is produced by one of the sub-beams of radiation at a particular time;
a data manipulation device configured to produce a control signal comprising spot exposure intensities to be produced by the patterning device based on a direct algebraic least-squares fit of spot exposure intensities to data derived from the requested dose pattern, wherein the least-squares fit is performed by multiplying a pseudo-inverted form of a point-spread function matrix by a column vector representing the pattern data derived from the requested dose pattern, the point-spread function matrix comprising information about a shape and relative position of the point-spread function of each spot to be exposed on the substrate by one of the sub-beams of radiation at a given time; and
a low-pass filter configured to remove spatial frequency components of a signal above a selected threshold frequency, incorporated offline into the pseudo-inverted form of the point-spread-function matrix, ready for the least-squares fit, by the following operation:

$$[K]^+_{filtered} = F_{low\text{-}pass\,filter} \otimes [K]^+,$$

wherein $[K]^+$ and $[K]^+_{filtered}$ are the pseudo-inverted form of the point-spread function matrix respectively before and after filtering, and
wherein $F_{low\text{-}pass\,filter}$ is a mathematical definition of the low-pass filter in a spatial domain.

2. The lithography apparatus of claim 1, further comprising:
a sharpening filter configured to sharpen a target product feature to be formed, defined in a spatial domain by mathematical function $F_{sharp\,filter}$, wherein the sharpening filter and the low-pass filter are incorporated offline into the pseudo-inverted form of the point-spread function matrix $[K]^+$ to form a filtered point-spread function matrix $[K]^+_{filtered}$ via the following operation:

$$[K]^+_{filtered} = F_{combined\,filter} \otimes [K]^+ = (F_{low\text{-}pass\,filter} \otimes F_{sharp\,filter}) \otimes [K]^+,$$

wherein $F_{combined\,filter}$ is a mathematical definition of the combined action of the low-pass filter and the sharpening filter in the spatial domain.

3. The lithography apparatus of claim 1, further comprising:
an image log slope filter configured to control an image log slope of the pattern to be formed on the substrate, defined in the spatial domain by mathematical function $F_{slope\,filter}$, wherein the image log slope filter and the low-pass filter are incorporated offline into the point-spread function matrix $[K]^+$ to form a filtered point-spread function matrix $[K]^+_{filtered}$ via the following operation:

$$[K]^+_{filtered} = F_{combined\,filter} \otimes [K]^+ = (F_{low\text{-}pass\,filter} \otimes F_{slope\,filter}) \otimes [K]^+,$$

wherein $F_{combined\,filter}$ is a mathematical definition of the combined action of the low-pass filter and the sharpening filter in the spatial domain.

4. The lithography apparatus of claim 1, further comprising:
a sharpening filter configured to sharpen a target product feature to be formed, defined in a spatial domain by mathematical function $F_{sharp\,filter}$; and
an image log slope filter configured to control an image log slope of the pattern to be formed on the substrate, defined in the spatial domain by mathematical function $F_{slope\,filter}$, wherein the sharpening filter, the image log slope filter, and the low-pass filter are incorporated offline into the point-spread function matrix $[K]^+$ to form a filtered point-spread function matrix $[K]^+_{filtered}$ via the following operation:

$$[K]^+_{filtered} = F_{combined\,filter} \otimes [K]^+ = (F_{low\text{-}pass\,filter} \otimes F_{sharp\,filter} \otimes F_{slope\,filter}) \otimes [K]^+,$$

wherein $F_{combined\,filter}$ is a mathematical definition of the combined action of the low-pass filter, the sharpening filter, and the image log slope filter in the spatial domain.

5. A lithography apparatus, comprising:
an illumination system configured to condition a beam of radiation;
a projection system configured to project the beam of radiation onto the substrate as an array of sub-beams of radiation;
a patterning device configured to modulate the sub-beams of radiation to substantially produce a requested dose pattern on the substrate, the dose pattern being built up from an array of spot exposures, each of the spot exposure being produced by one of the sub-beams of radiation at a particular time, wherein the radiation intensity of a given sub-beam of radiation is controlled according to an activation state of a corresponding portion of the patterning device;
a dose sensor configured to measure a source intensity of the beam of radiation and a spot intensity of the sub-beams of radiation on the substrate; and
a data manipulation device configured to transform a signal comprising spot exposure radiation doses derived from the requested dose pattern to a control signal representing activation states of the patterning device to produce the requested dose pattern, wherein the transformation corrects for intensity variations measured by the dose sensor as a ratio between the source intensity and the spot intensity and caused by at least one of components of the projection system, components of the illumination system, radiation sources for the illumination system, and components of the patterning device.

6. The lithography apparatus of claim 5, wherein the data manipulation device comprises:
a memory device configured to store a lookup table, the data manipulation device accessing the lookup table to convert from an activation state for a particular portion of the patterning device to a corresponding control voltage to produce the activation state for that portion, wherein the transformation is performed by changing at least a subset of values in the lookup table.

7. The lithography apparatus of claim 5, wherein the data manipulation device comprises:
  a multiplier configured to convert a spot exposure radiation dose produced by a particular portion of the patterning device to an activation state for that portion, wherein the transformation is performed by changing a gain characteristic of the multiplier.

8. A method, comprising:
  projecting a beam of radiation onto a substrate as an array of sub-beams of radiation;
  modulating the sub-beams of radiation to substantially produce a requested dose pattern on the substrate, the dose pattern being built up from an array of spot exposures in which at least neighboring ones of the spot exposures are imaged incoherently with respect to each other and each of the spot exposures is produced by one of the sub-beams of radiation at a particular time;
  producing a control signal comprising spot exposure intensities to be produced by the modulating based on a direct algebraic least-squares fit of the spot exposure intensities to data derived from the requested dose pattern, wherein the least-squares fit is performed by multiplying a pseudo-inverted form of a point-spread function matrix by a column vector representing the pattern data derived from the requested dose pattern, the point-spread function matrix comprising information about the shape and relative position of the point-spread function of each spot to be exposed on the substrate by one of the sub-beams of radiation at a given time; and
  filtering to remove spatial frequency components of a signal above a selected threshold frequency, incorporated offline into the pseudo-inverted form of the point-spread-function matrix, ready for the least-squares fit, by the following operation:

$$[K]^+_{filtered} = F_{low\text{-}pass\,filter} \otimes [K]^+,$$

wherein $[K]^+$ and $[K]^+_{filtered}$ are the pseudo-inverted form of the point-spread function matrix respectively before and after filtering, and where $F_{low\,pass\,filter}$ represents a mathematical definition of the filtering in the spatial domain.

9. A method, comprising:
  conditioning a beam of radiation;
  detecting a source dose intensity of the beam of radiation;
  projecting the beam of radiation onto the substrate as an array of sub-beams of radiation;
  detecting a spot dose intensity of the sub-beams of radiation on the substrate;
  modulating the sub-beams of radiation to substantially produce a requested dose pattern on the substrate, the dose pattern being built up from an array of spot exposures, each of the spot exposures being produced by one of the sub-beams of radiation at a particular time;
  controlling radiation intensity of a given one of the sub-beams of radiation according to an activation state of a corresponding portion of a patterning device that performs the modulating;
  transforming a signal comprising spot exposure radiation doses derived from the requested dose pattern to a control signal representing activation states of the patterning device to substantially produce the requested dose pattern; and
  modifying the transforming step to correct for intensity variations determined by a ratio of the detected source and spot dose intensities and caused by at least one of components of the projection system, components of the illumination system, radiation sources for the illumination system, and components of the patterning device.

* * * * *

UNITED STATES PATENT AND TRADEMARK OFFICE
CERTIFICATE OF CORRECTION

| | | |
|---|---|---|
| PATENT NO. | : 7,864,295 B2 | Page 1 of 1 |
| APPLICATION NO. | : 12/166837 | |
| DATED | : January 4, 2011 | |
| INVENTOR(S) | : Tinnemans et al. | |

It is certified that error appears in the above-identified patent and that said Letters Patent is hereby corrected as shown below:

Claim 2, column 31, lines 55-56, please delete the equation and insert

-- $[K]^+_{\text{filtered}} = F_{\text{combined filter}} \otimes [K]^+ = (F_{\text{low-pass filter}} \otimes F_{\text{sharp filter}}) \otimes [K]^+$ --

Claim 3 column 32, lines 5-6, please delete the equation and insert

-- $[K]^+_{\text{filtered}} = F_{\text{combined filter}} \otimes [K]^+ = (F_{\text{low-pass filter}} \otimes F_{\text{slope filter}}) \otimes [K]^+$ --

Claim 4, column 32, lines 25-26, please delete the equation and insert

- $[K]^+_{\text{filtered}} = F_{\text{combined filter}} \otimes [K]^+ = (F_{\text{low-pass filter}} \otimes F_{\text{sharp filter}} \otimes F_{\text{slope filter}}) \otimes [K]^+$ --

Signed and Sealed this
Fifth Day of April, 2011

David J. Kappos
*Director of the United States Patent and Trademark Office*